United States Patent
Katsuki et al.

(10) Patent No.: US 12,543,530 B2
(45) Date of Patent: Feb. 3, 2026

(54) SUBSTRATE TRANSFER METHOD, SUBSTRATE PROCESSING APPARATUS, AND RECORDING MEDIUM

(71) Applicant: Tokyo Electron Limited, Tokyo (JP)

(72) Inventors: Shingo Katsuki, Koshi (JP); Kenichirou Matsuyama, Koshi (JP); Sho Kano, Koshi (JP); Saori Kosaki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 202 days.

(21) Appl. No.: 18/345,100

(22) Filed: Jun. 30, 2023

(65) Prior Publication Data

US 2024/0006214 A1    Jan. 4, 2024

(30) Foreign Application Priority Data

Jul. 1, 2022  (JP) ................................. 2022-107171
Jan. 27, 2023  (JP) ................................. 2023-010672

(51) Int. Cl.
*H01L 21/677* (2006.01)
*B65G 47/90* (2006.01)
*H01L 21/67* (2006.01)

(52) U.S. Cl.
CPC ........ *H01L 21/67727* (2013.01); *B65G 47/90* (2013.01); *H01L 21/67173* (2013.01)

(58) Field of Classification Search
CPC .............. B65G 47/90; H01L 21/67173; H01L 21/67727
See application file for complete search history.

(56) References Cited

U.S. PATENT DOCUMENTS

| 7,262,829 | B2* | 8/2007 | Hayashida | .......... | G03F 7/70533 |
| | | | | | 396/611 |
| 2006/0183340 | A1* | 8/2006 | Hayashida | .......... | G03F 7/70533 |
| | | | | | 438/758 |
| 2006/0287200 | A1* | 12/2006 | Kaneko | ............. | H01L 21/67155 |
| | | | | | 505/126 |

(Continued)

FOREIGN PATENT DOCUMENTS

JP    2008-130857 A    6/2008

*Primary Examiner* — Saul Rodriguez
*Assistant Examiner* — Brendan P Tighe
(74) *Attorney, Agent, or Firm* — Chrisman Gallo Tochtrop LLC

(57) ABSTRACT

A substrate transfer method performed in a substrate processing apparatus including a transfer mechanism group configured to transfer a substrate into a carrier via a module group and an exposure apparatus is provided. The transfer mechanism group includes a first transfer mechanism configured to transfer the substrate in an order of the pre-stage module, the exposure apparatus, and a first post-stage module, and a second transfer mechanism configured to transfer the substrate in an order of the first post-stage module, a heating module, a developing module, and a second post-stage module, a post-stage transfer mechanism. The substrate transfer method includes comparing an exposure apparatus cycle time with a section transfer time required to transfer the substrate from a transfer section by the second transfer mechanism to a transfer section by the post-stage transfer mechanism; and setting the section transfer time based on a result of the comparing.

16 Claims, 21 Drawing Sheets

(56) References Cited

U.S. PATENT DOCUMENTS

| | | | |
|---|---|---|---|
| 2008/0117390 A1* | 5/2008 | Kaneko | H01L 21/67225 |
| | | | 355/27 |
| 2009/0041926 A1* | 2/2009 | Miyata | H01L 21/67276 |
| | | | 118/712 |
| 2012/0067698 A1* | 3/2012 | Kimata | H01L 21/67294 |
| | | | 198/464.1 |
| 2020/0006100 A1* | 1/2020 | Clark | H01L 21/68707 |
| 2021/0159293 A1* | 5/2021 | Kuwahara | H10K 59/124 |
| 2022/0139756 A1* | 5/2022 | Lee | H01L 21/67109 |
| | | | 414/225.01 |

* cited by examiner

PJ-A,PJ-B⋯DIFFERENT FLOWS

SUBSTRATE TRANSFER METHOD, SUBSTRATE PROCESSING APPARATUS, AND RECORDING MEDIUM

CROSS-REFERENCE TO RELATED APPLICATION

This application claims the benefit of Japanese Patent Application Nos. 2022-107171 and 2023-010672 filed on Jul. 1, 2022 and Jan. 27, 2023, respectively, the entire disclosures of which are incorporated herein by reference.

TECHNICAL FIELD

The various aspects and exemplary embodiments described herein pertain generally to a substrate transfer method, a substrate processing apparatus, and a recording medium.

BACKGROUND

In manufacturing a semiconductor device, photolithography is performed on a semiconductor wafer (hereinafter, simply referred to as a wafer). Specifically, the wafer is transferred between modules within a substrate processing apparatus to be subjected to heating called post exposure bake (PEB) and development in sequence after a resist film is exposed according to a predetermined pattern in an exposure apparatus. In the disclosure of Patent Document 1, wafers are transferred such that time taken before the PEB is performed after the exposure is maintained constant between the wafers.

Patent Document 1: Japanese Patent Laid-open Publication No. 2008-130857

SUMMARY

In an exemplary embodiment, there is provided a substrate transfer method performed in a substrate processing apparatus including a transfer mechanism group configured to transfer a substrate taken out from a carrier back into the carrier via a module group and an exposure apparatus. The module group includes a pre-stage module configured to place the substrate therein in an upstream of the exposure apparatus, a first and a second post-stage modules each configured to place the substrate therein in a downstream of the exposure apparatus, a heating module, and a developing module. The transfer mechanism group includes a first transfer mechanism configured to transfer the substrate in an order of the pre-stage module, the exposure apparatus, and the first post-stage module, and a second transfer mechanism configured to transfer the substrate in an order of the first post-stage module, the heating module, the developing module, and the second post-stage module, and one or more post-stage transfer mechanisms each configured to transfer the substrate from the second post-stage module toward the carrier. The substrate transfer method includes, when an interval between a time point when the substrate is carried into the exposure apparatus and a time point when the substrate is allowed to be carried out of the exposure apparatus is set as an exposure apparatus cycle time, comparing the exposure apparatus cycle time with a section transfer time, which is acquired for the substrate scheduled to be transferred to the exposure apparatus, required to transfer the substrate from a transfer section by the second transfer mechanism to a transfer section by the post-stage transfer mechanism; and setting the section transfer time based on a result of the comparing.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
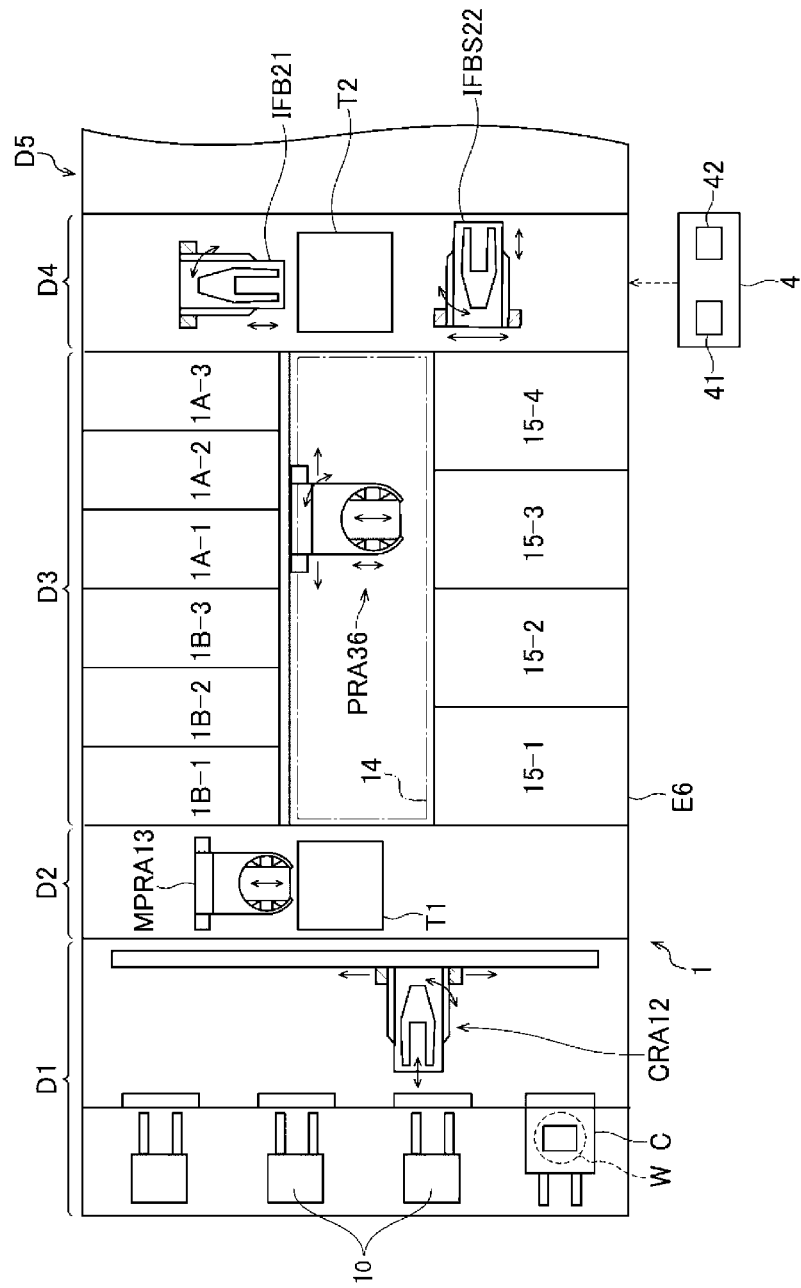
FIG. 1 is a plan view of a coating and developing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

[Configuration of Coating and Developing Apparatus]

A coating and developing apparatus 1 as an exemplary embodiment of a substrate processing apparatus according to the present disclosure will be described with reference to a plan view of FIG. 1 and a longitudinal side view of FIG. 2. The coating and developing apparatus 1 is composed of a carrier block D1, an intermediate block D2, a processing block D3, and an interface block D4 that are connected in a row in a left-and-right direction. An exposure apparatus D5 is connected to the right side (opposite to the side where the carrier block D1 is located) of the interface block D4.

The carrier block D1 has a stage 10, and a carrier C, which is a transfer container called a FOUP (Front Opening Unify Pod) capable of accommodating therein a plurality of wafers W, may be placed on the stage 10. Further, the carrier block D1 is equipped with a transfer mechanism 12 configured to transfer the wafers W to/from the carrier C on the stage 10.

The intermediate block D2 is provided with a tower T1 in which a number of modules are stacked. The aforementioned transfer mechanism 12 and a transfer mechanism 13 disposed at the rear of the tower T1 are accessible to each of these modules of the tower T1. The transfer mechanisms 12 and 13 cooperate to transfer the wafers W between the carrier C and respective levels of the processing block D3 to be described later.

In the processing block D3, levels E1 to E6 each configured to perform a liquid processing and a heating processing on the wafers W are stacked in sequence from the bottom. In the present exemplary embodiment, the levels E1 to E3 have the same configuration, and they are configured to perform, as the liquid processing, formation of a resist film by coating of a resist. Further, the levels E4 to E6 have the same configuration, and they are configured to perform, as the liquid processing, the formation of the resist pattern by development. In the respective levels E (E1 to E6), the transfers and the processings of the wafers W are performed in parallel.

As a representative of the levels E1 to E6, the level E6 shown in FIG. 1 will be described. A transfer path 14 for the wafer W extending in the left-and-right direction is formed at the center of the level E6 in a front-and-rear direction. In front of the transfer path 14, a plurality of developing modules 15 are arranged in the left-and-right direction. At the rear of the transfer path 14, heating modules configured to heat the wafer W are stacked, and a multiple number of stacked bodies of these heating modules are arranged in the left-and-right direction. These heating modules include one configured to perform PEB and one configured to perform heat treatment after development (post-bake). Regarding the heating modules, it is assumed here that two types of heating modules 1A and 1B are employed. Unless otherwise specified, the heating module 1A is regarded as performing the PEB while the heating module 1B is regarded as performing the post-bake.

A transfer mechanism 36 configured to transfer the wafer W in the level E6 is provided in the transfer path 14. The transfer mechanism 36 includes a base configured to be moved in the transfer path 14 and two substrate holders configured to be moved forward and backward on the base. One of the substrate holders is moved forward and backward to receive a wafer W from a module, and the other substrate holder is advanced into the corresponding module to carry in a wafer W, thus allowing the wafer W to be replaced in the module. This replacement with respect to the module may be referred to as replacement transfer. Here, a module is a place, other than the transfer mechanism, where the wafer W is placed, and a module configured to perform a processing on the wafer W may sometimes be referred to as a processing module.

Focusing on distinctive features of the levels E1 to E3 from the level E6, the levels E1 to E3 are equipped with, instead of a developing module, a coating module configured to form a resist film by supplying a resist to the wafer W. Further, a heating module in the levels E1 to E3 heats the wafer W after being subjected to the formation of the resist film. Further, transfer mechanisms of the individual levels E1 to E5 corresponding to the transfer mechanism 36 will be assigned reference numerals 31 to 35.

Now, the interface block D4 will be described. The interface block D4 is provided with a tower T2 and transfer mechanisms 21 and 22. The same as in the tower T1, a number of modules are stacked in the tower T2. The transfer mechanism 21 performs a transfer between the modules of the tower T2, and the transfer mechanism 22 performs a transfer between the modules of the tower T2 and the exposure apparatus D5. Actually, the interface block D4 is provided with more modules, towers, and transfer mechanisms than shown in the figure. However, to avoid complication of the explanation, the interface block D4 is illustrated in a simplified manner. For the above-described processing block D3 as well, description and illustration of some modules are omitted.

The towers T1 and T2 will be described. The towers T1 and T2 are provided with transit modules TRS and temperature control modules SCPL. These modules are used to carry the wafers W into and out of the levels E1 to E6 and to deliver the wafer W between the blocks or between the block and the exposure apparatus D5. The SCPL is a module configured to adjust the temperature of the wafer W. In addition to the aforementioned purpose of carrying the wafer W in and out or transferring the wafer W between the blocks, the SCPL is also used to adjust the temperature of the wafer W while being transferred in the corresponding level and to adjust the temperature of the wafer W immediately before being transferred to the exposure apparatus. The SCPL configured to perform the temperature control over the wafer W immediately before being transferred to the exposure apparatus D5 will be referred to as ICPL. Each of the TRS and the SCPL for the above-described uses is plural in number. In the following description, as shown in FIG. 2, TRSs and SCPLs will be appropriately assigned reference numerals to be distinguished in terms of locations where they are disposed.

[Regarding Exposure Apparatus]

When the wafer W is ready to be carried into the exposure apparatus D5, the exposure apparatus D5 outputs a signal to that effect (in-ready signal), and when the wafer W is ready to be carried out of the exposure apparatus D5, the exposure apparatus D5 outputs a signal to that effect (out-ready signal). A controller 4 to be described later receives these signals and controls the operation of the transfer mechanism 22, thus allowing the wafer W to be delivered between the interface block D4 and the exposure apparatus D5. An interval between a time point when one wafer W is carried into the exposure apparatus D5 and a time point when the exposure of the wafer W is ended and the out-ready signal is outputted is referred to as an exposure apparatus cycle time. In transferring the wafers W into the exposure apparatus D5, the exposure apparatus cycle time (sometimes abbreviated as exposure apparatus CT) is constant or approximately constant. When the wafers W are transferred at this constant cycle, the out-ready signal is outputted at a regular or approximately regular cycle.

[Regarding PJ]

If the carrier C is carried into the coating and developing apparatus 1, a process job PJ is set for the wafers W in the carrier C by the controller 4 to be described later. The PJ is information that specifies a processing recipe for the wafer W (including a transfer recipe such as which type of module the wafer W is to be transferred to and processed by, which one of the same type of modules the wafer W is to be transferred to) and specifies the wafer W to be transferred. In this way, a transfer path of the wafer W in the coating and developing apparatus 1 is designated by the PJ. Since the wafers W of the same PJ are subjected to the same processing, the wafers W of the same PJ belong to the same lot.

Further, the processing recipe designated by the PJ includes information for operating individual units constituting the module. More specifically, such information includes the time required for the operation of each unit in the module, a heating temperature in case of heating the wafer W, the timing and the order of supplying liquids to the wafer W in case of performing a liquid processing on the wafer W, and so forth. Thus, by the setting the PJ, parameters (MSCT, ACT, etc.) for each transfer control to be described later can be calculated.

In addition, assuming that there are a plurality of wafers W of one PJ and a plurality of wafers W of another PJ, operations of the individual transfer mechanisms are controlled by a controller 4 to be described later such that the wafers W of another PJ are sequentially carried into the apparatus after the wafers W of the one PJ are sequentially carried into the apparatus. That is, after the wafers W of the preceding PJ are carried into the apparatus collectively, the wafers W of the succeeding PJ are carried into the apparatus collectively. Then, each wafer W is transferred along a transfer path designated by the corresponding PJ, and is processed in each processing module on the transfer path according to the processing recipe designated by the corresponding PJ. The wafer W of the PJ transferred first is returned back into the carrier C first. For the one PJ, when all of the wafers W of this PJ are returned back into the carrier C, the processing of the corresponding PJ is ended.

[Regarding Layers]

Among the above-described devices, individual names may be assigned to the transfer mechanisms to distinguish them from each other. Specifically, the transfer mechanisms 12 and 13 may be respectively referred to as CRA12 and MPRA13, the transfer mechanisms 31 to 36 may be respectively referred to as PRA31 to PRA36, and the transfer mechanisms 21 and 22 may be respectively referred to as IFB21 and IFBS22. Further, in the transfer path, respective sections in which the transfer is performed by the different transfer mechanisms will be referred to as "layers". The layers corresponding to the transfer mechanisms other than the PRAs (PRA31 to PRA36) are indicated by giving the same names as those of their transfer mechanisms. Therefore, the respective layers are referred to as a CRA layer, an MPRA layer, an IFB layer, and an IFBS layer. The layers corresponding to the PRA31 to PRA33 are referred to as a COT layer, and the layers corresponding to PRA34 to PRA36 are referred to as a DEV layer. For the DEV layer, the term "layer" may sometimes be omitted so it may be simply referred to as DEV.

In addition, layers including a plurality of blocks configured to perform the same processing on the wafer W are regarded as a multi-stack. That is, the multi-stack layers include modules that perform the same processing at the same stage, and this block is referred to as a stack. When an example of transferring the wafer W through a transfer path H1 is described later, each of the COT layer and the DEV layer forms a multi-stack layer. In addition, the layers forming this multi-stack will be described as one layer as a whole. That is, although the levels E4, E5, and E6 have been described to have the same configuration, these three levels E4 to E6 (stacks) do not form three DEV layers, respectively, but they form a single DEV layer together. Further, although FIG. 4 or the like illustrates a module configuration of the DEV layer, it does not show the entire DEV layer but illustrates modules of only one level.

As for the COT layer and the DEV layer, the transfer mechanism of each layer repeatedly moves to the modules in that layer in sequence to perform the above-described replacement of the wafer W for each module except for the module at the entrance and the module at the exit of the layer. Accordingly, the transfer mechanism moves all the way around the transfer path 14. By such an operation of the transfer mechanism, the wafers W are sequentially transferred from the module on the upstream side to the module on the downstream side one by one. Further, when the PJs are switched, the replacement transfer may not be successfully carried out because a transfer interval of the wafers W to the modules is enlarged. Further, as for the transfer to another layer, when the wafer W is transferred to the module on the upstream side, the transfer mechanism in that layer receives the wafer W, and transfers it to the module on the downstream side. Such a transfer will be referred to as asynchronous transfer.

[Description of Transfer Path]

Figure 3:
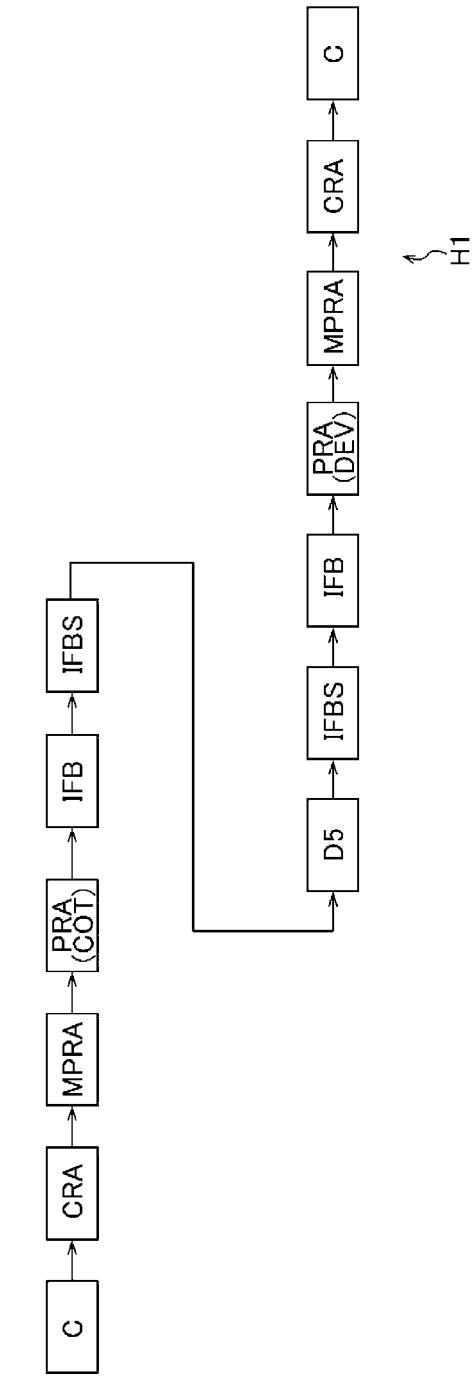
FIG. 3 is an explanatory diagram illustrating a transfer path in the coating and developing apparatus.
Figure 4:
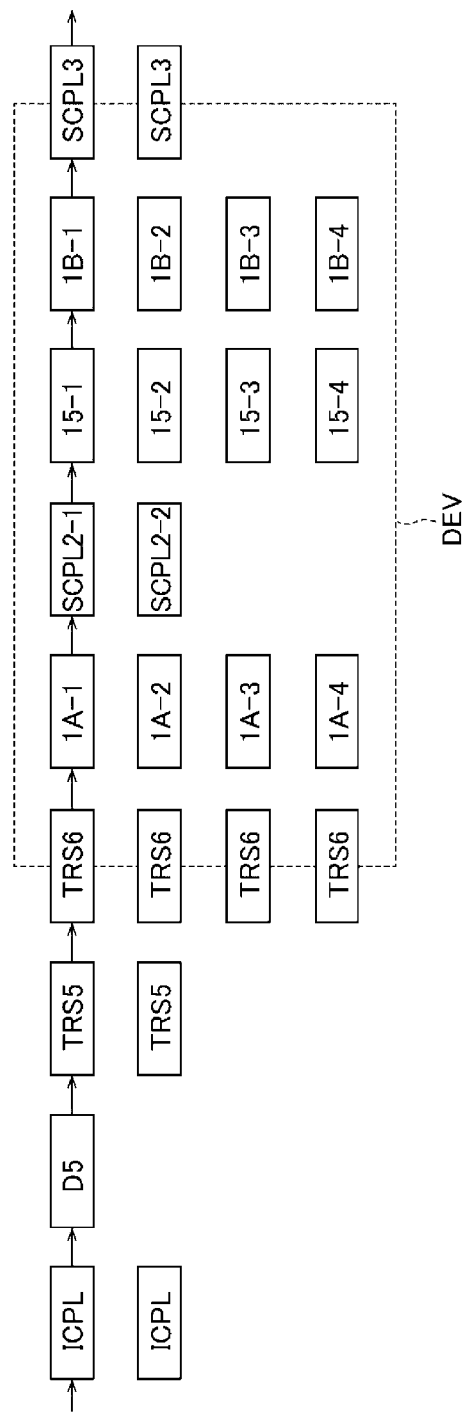
FIG. 4 is an explanatory diagram illustrating a transfer path on a latter side of an exposure apparatus.

One of transfer paths designated by the PJ will be described as H1. FIG. 3 shows the transfer path H1 in unit of layer. Further, the exposure apparatus D5 and the carrier C are shown separately from the layer. FIG. 4 shows the order of transfer for the modules from a module immediately before the exposure apparatus D5 to the exit of the DEV layer (entrance of a layer after the DEV layer) in the transfer path H1. This transfer path H1 is a path in which the wafer W passes through one of the levels E1 to E3, the exposure apparatus D5, and one of the levels E4 to E6. Through this transfer path H1, a resist pattern is formed on the wafer W.

The wafers W sent out from the carrier C by the CRA12 are transferred to the transit module TRS1 of the tower T1, and then distributed by the MPRA13 to the transit modules TRS2 of different heights corresponding to the levels E1 to E3 in the tower T1. Then, the wafers W are respectively received by the PRA31 to the PRA33 and transferred in the order of the temperature control module SCPL1→the coating module→the heating module. The wafers W each having the resist film formed thereon as a result of being transferred in this way are then transferred to the transit modules TRS3 of the tower T2 to be transferred in the order of IFB21→TRS4 of the tower T2→IFB21→ICPL→IFBS22→exposure apparatus D5, whereby the resist film is exposed according to the predetermined pattern.

The wafers W after being subjected to the exposure are transferred in the order of IFBS22→TRS5 of the tower T2, and then distributed by IFB21 to the transit modules TRS6 of the different heights corresponding to the levels E4 to E6. Then, the wafers W are transferred by the PRA34 to the PRA36 in the order of heating module 1A→SCPL2→developing module 15. As a result, the resist film is developed, so that the resist pattern is formed on each wafer W. Thereafter, the wafer W is transferred in the order of heating module 1B→SCPL3 of the tower T1, and is then transferred in the order of MPRA13→transit module TRS7→CRA12→carrier C. Therefore, in the unit of layer, the wafer W is transferred in the order of CRA layer→MPRA layer→COT layer→IFB layer→IFBS layer→exposure apparatus D5→IFBS layer→IFB layer→DEV layer→MPRA layer→CRA layer in the transfer path H1.

In the layer, a time interval for transferring the wafer W to each next layer on the transfer path is referred to as CT (cycle time) of the layer. More specifically, the CT is a time required for the transfer of the wafer W for one cycle in the layer, that is, a time required to carry out the transfer of the wafer W once between the respective modules handled by the transfer mechanism, and corresponds to an expected time interval for transferring the wafer W to the next layer. Specifically, in the above-described transfer path H1, a transfer destination of the wafer W is the MPRA layer in the DEV layer, and a time interval for transferring a single sheet of wafer W to this MPRA layer is the CT of the DEV layer. From the MPRA layer, the wafer W is transferred to each of the COT layer and the CRA layer, and a total time required to transfer the single sheet of wafer W to both of these layers is the CT of the MPRA. In addition, in the DEV layer and the COT layer, the PRA moves all the way around between the modules as stated above, and the CT of the layer corresponds to a time (lap time) during which this one-round moving is performed once. Specifically, the CT of each of the DEV layer or the COT layer is calculated by dividing the lap time of the PRA by the number of stacks (lap time of the PRA/the number of stacks). That is, the value obtained by dividing a time from when the PRA accesses the TRS6 at the entrance of the DEV layer until the PRA accesses the TRS6 next by the number of stacks is the CT of the DEV layer. The number of stacks is the number of sets when the TRS6 constituting the entrance of the DEV layer, the SCPL3 constituting the exit of the DEV layer, the developing module 15, the heating modules 1A and 1B, and the PRA are set into one set.

In the above-described transfer path H1, the temperature control module ICPL corresponds to a pre-stage module in which a substrate is placed before being sent to the exposure apparatus D5, and the transit modules TRS5 and TRS6 correspond to a first post-stage module, and the SCPL3 corresponds to a second post-stage module. The transfer mechanisms 21 and 22 correspond to a first transfer mechanism configured to transfer the wafers W between the ICPL, the exposure apparatus D5, the TRS5 and the TRS6; the PRA34 to the PRA36 correspond to a second transfer mechanism; and the transfer mechanisms 12 and 13 correspond to a post-stage transfer mechanism configured to transfer the wafers W from the DEV layer toward the carrier C.

[Regarding Multi-Module]

In a single layer, a plurality of processing modules at the same stage (order of transfer) on the transfer path from the carrier C and capable of performing the same type of processing on the wafers W are regarded as a multi-module. For example, the four heating modules 1A shown in FIG. 4 constitute the same multi-module, and the two temperature control modules SCPL2 constitute the same multi-module. The aforementioned PJ also designates how many processing modules in the multi-module are to be used. The individual processing modules in the multi-module may be distinguished from each other by being given different numbers after hyphens.

[Regarding Controller]

Figure 2:
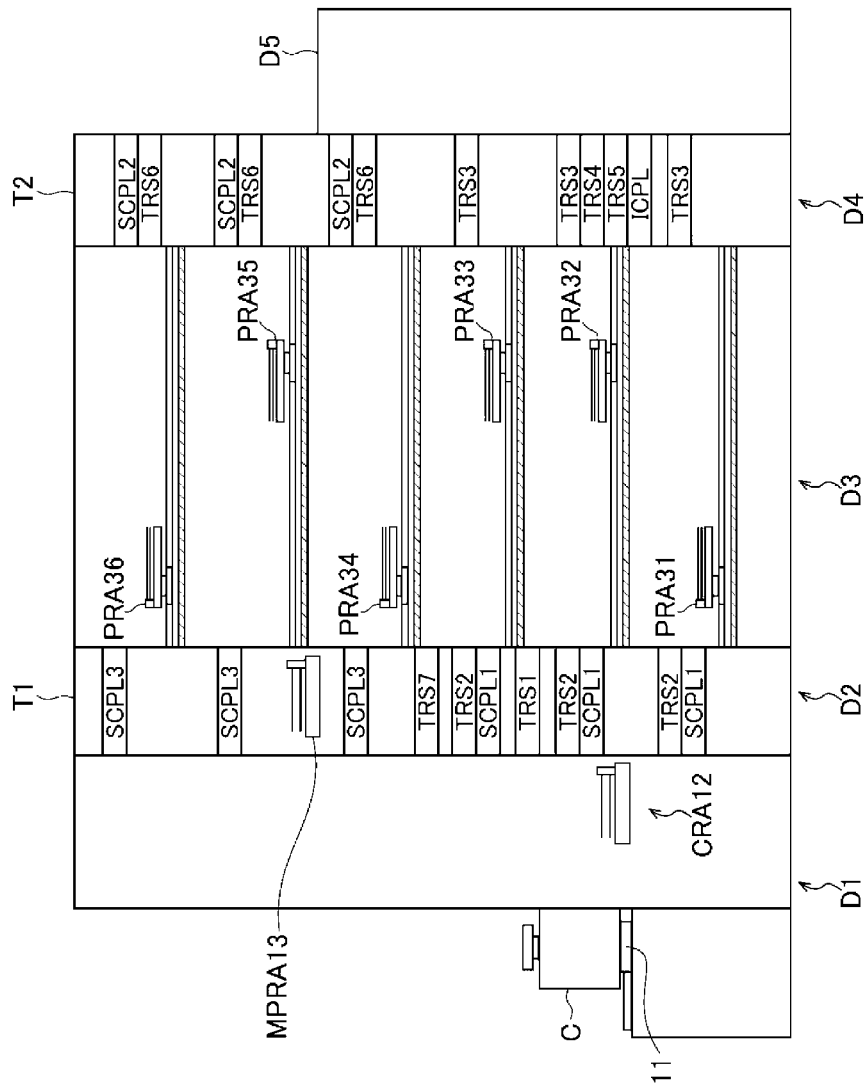
FIG. 2 is a longitudinal side view of the coating and developing apparatus.

As depicted in FIG. 1, the coating and developing apparatus 1 includes the controller 4 implemented by a computer. The controller 4 has a program 41. The program 41 includes process groups organized such that a transfer of the wafer W to be described later and a processing of the wafer W in each module are performed, and the program 41 causes a control signal to be outputted to each module or each transfer mechanism for the wafer W. Each module or each transfer mechanism is operated in response to the control signal. The program 41 is stored in a recording medium such as a compact disk, a hard disk, or a DVD, and is installed to the controller 4. Further, the program 41 enables various calculations, comparisons and determinations required to perform the respective transfer controls to be described later, thus implementing the respective transfer controls. In addition, the comparisons mentioned here also include subtraction between numerical values.

The controller 4 is equipped with a setting unit 42 through which a user of the apparatus performs various settings, and the setting unit 42 is composed of a mouse, a keyboard, a touch panel, and so forth. Hereafter, selection of each transfer control to be described later, blocking of modules and/or layers, and various settings and selections that can be made in performing each transfer control can be performed through the setting unit 42. Further, although not shown, the controller 4 is also provided with a storage that stores various kinds of parameters required to perform each transfer control. Also, the controller 4 is provided with an alarm output unit configured to output an alarm with a sound or a screen display. For example, the alarm is set forth when the wafer W cannot be carried into the exposure apparatus D5 as will be described later.

[Outline of Transfer Controls]

The outline of the transfer control performed by the controller 4 will be described below. As exemplified through the transfer path H1, in processing the wafer W in each DEV layer after the exposure, the transfer control is performed such that the time (post exposure delay (PED) time) from the output of the out-ready signal of the exposure apparatus D5 to the start of the PEB is constant or approximately constant between the wafers W. Further, the PED time is set to fall within a preset range not only in the same PJ but also between different PJs. As described above, by suppressing fluctuation of the PED time between the wafers W, diffusion of an acid generated in the chemically amplified resist by the exposure in the exposure apparatus D5 is made uniform between the wafers W, so that uniformity in the width of the resist pattern is improved.

The outline of the transfer control will be described. As shown in FIG. 3 and FIG. 4, it is assumed that wafers W of each PJ are transferred in the apparatus in sequence. Here, there is a risk that the transfer of the wafer W may be delayed in any one of layers on the latter side (downstream) of the exposure apparatus D5 in the transfer path H1, causing the wafer W to stay so that the transfer of the wafer W in a layer on the upstream side thereof may be delayed as well.

Therefore, if the transfer interval of the wafer W in the downstream of the exposure apparatus D5 is not controlled, there may arise an occasion in which the wafer W has to stay in the TRS of the tower T2, which is the entrance of the DEV layer, for example. As stated above, each of the PRA34 to the PRA36 of the DEV layer moves cyclically to transfer the wafer W. Therefore, if each of the PRA34 to PRA36 receives one wafer W from the TRS at the entrance of the DEV layer, they cannot receive the next wafer W from the TRS until the current one-round moving is completed. Therefore, since the time interval from when the wafer is transferred to the TRS until it is received by the PRA34 (PRA35, PRA36) becomes relatively large, the transfer of the wafer W to the heating module 1A may also be delayed, which may result in non-uniformity in the PED time.

To solve the problem, in the transfer control of the present exemplary embodiment, a carry-out interval of the wafer W from the exposure apparatus D5 is controlled to be equal to an expected transfer time of, among the respective layers in the downstream of the exposure apparatus D5, the next layer whose expected transfer time of the wafer W is the longest. Further, in the last layer (CRA layer) on the transfer path, the "next layer" is the carrier C. In this way, by controlling the carry-out interval of the wafers W from the exposure apparatus D5 and controlling an input amount of the wafers W into the DEV layer, the wafers W are suppressed from staying at the entrance of the DEV layer, so that an increase of the PED time can be suppressed so that the PED time falls within the preset range.

In the transfer control of the present exemplary embodiment as described above, the transfer control of the wafer W with respect to the exposure apparatus D5 is performed in consideration of not only the transfer condition from the exposure apparatus D5 to the heating module 1A configured to perform the PEB, but also the transfer condition in the downstream of the heating module 1A. Thus, since the transfer condition of each layer is considered, the non-uniformity of the PED time can be more reliably suppressed. Furthermore, by considering the transfer condition of each layer in this way, even if blocking of a module is performed, fluctuation of the PED time can be suppressed. The transfer control of suppressing the fluctuation of the PED time in this way includes a first transfer control and a second transfer control, and either one of them is selected by the user of the coating and developing apparatus 1 to be executed.

[Regarding Parameters MUTCT, MSCT and ACT in Transfer Control]

To describe the outline of the first transfer control and the second transfer control in further detail, max step cycle time (MSCT) and arm cycle time (ACT), which are parameters used in these transfer controls, will be explained. From the processing recipe specified by the PJ, calculation of "processing time of wafer W"+"time required before and after processing (OHT: Over Head Time)"="staying time (MUT: Module Using Time) of wafer W required in module" is conducted for each module. Then, calculation according to Expression 1 below is performed.

(MUT÷number of available modules)×transfer ratio    Expression 1

The number of available modules in Expression 1 is the number of modules that can be used in the stage of calculating the MUT, and it is the number in one stack and is calculated by subtracting, from the number of modules set in the PJ, the number of modules turned into a state in which they are not used because of trouble occurrence or blocking. Further, in the above expression, the transfer ratio is the number of wafers W transferred to one stack divided by the number of wafers W transferrable to all available stacks that constitute the multi-stack. For the modules at a certain stage, the calculation of Expression 1 is performed for each stack, and the maximum value among the calculated values is regarded as MUT cycle time (MUTCT). In one layer, the MUTCT is calculated from each module except for the module at the entrance and the module at the exit (that is, the modules shared with another layer).

Specifically, assume that the DEV layer is composed of three stacks, all three of these stacks are available, and the PJ is set such that the wafers W can be evenly transferred to these three stacks. Thus, the transfer ratio is 1/3. As a condition therefor, assuming that the MUT of this developing module 15 is J seconds and four developing modules are available in each stack, calculation of J seconds/4×1/3=J/12 seconds is made from Expression 1. Since the transfer ratio is the same between the stacks, the same calculation is made between the stacks, so the maximum value calculated in Expression 1 is J/12 seconds. Accordingly, the MUTCT (Module Using Time Cycle Time) of the developing module 15 is calculated as J/12 seconds.

In the DEV layer, MUTCT is also calculated in the same way for the heating modules 1A and so forth. Further, since the MUTCT is calculated as described above for the modules other than the modules constituting the entrance and the exit of the layer, the MUTCTs of the heating modules 1A and 1B, the SCPL2, and the developing module 15 are calculated in the DEV layer.

In addition, since a processing time of the module used for the calculation of the MUTCT is set for each PJ, the MUTCT is calculated for each PJ. In Expression 1, the transfer ratio is regarded as 1 for a non-multi-stack layer and an asynchronous transfer layer (in the present exemplary embodiment, non-multi-stack layer=asynchronous transfer layer). Among the MUTCT values acquired from the layers as the acquisition target (which will be described later), the maximum value is called max step cycle time (MSCT).

Now, the arm cycle time (ACT) will be described. How many times the transfer mechanism (transfer arm) transfers the wafer W from the entrance to the exit of the layer is defined as the number of transfer processes. Regarding the transfer path H1, since the wafer W is transferred five times (such as TRS6→heating module 1A→temperature control module SCPL2→developing module 15→heating module 1B→SCPL3) in the DEV layer, the number of transfer processes is 5 (five). As an example of another layer, in the MPRA layer, since the wafer is transferred twice (such as TRS1→TRS2, SCPL3→TRS7), the number of transfer processes is two.

A set time required for a single transfer process is predetermined as K seconds, for example. The ACT is calculated as ACT=the number of transfer processes×set time÷the number of multi-stacks to which the wafers W are transferrable. As for the aforementioned DEV layer, there are three stacks, and the wafers W are transferrable to all of these three stacks. Thus, the ACT is calculated as 5×K÷3=5K/3 seconds. Further, the number of multi-stacks is calculated as 1 for the non-multi-stack layers and the asynchronous transfer layers. So far, only the transfer path H1 has been exemplified as the transfer path in FIG. 3 and FIG. 4. However, various transfer paths are set by the PJ. In other words, since the number of transfer processes differs depending on the PJ, the ACT is also calculated for each PJ.

Further, a cycle time of the layer described above may be set to be equal to or larger than the large one of the maximum value of the MUTCTs and the ACT obtained from the respective modules in the one layer. Thus, the cycle time of the layer obtained from the MUTCTs and the ACT corresponds to the expected transfer time required for the transfer of the wafer W to the next layer.

[Regarding Outline of First and Second Transfer Controls]

As described above, the wafers W are transferred into the coating and developing apparatus 1 collectively for each PJ. For this reason, when transferring the wafer W of a certain PJ, which is supposed to be transferred through the transfer path H1, from the temperature control module ICPL into the exposure apparatus D5 or carrying out the wafer W from the exposure apparatus D5, a wafer of the same PJ as the corresponding wafer W or a wafer of a PJ prior to the corresponding PJ may be placed in each layer in the downstream of the exposure apparatus D5. For that corresponding PJ, the MUTCT (Module Using Time Cycle Time), the MSCT (Max Step Cycle Time) and the ACT (Arm Cycle Time) are obtained from each layer through which the wafer W is to pass in the downstream of the exposure apparatus D5. Among the MSCT and the ACT values, the maximum is set as a maximum cycle time after exposure (hereinafter, referred to as "maximum post-exposure cycle time").

Since the layer for which this maximum post-exposure cycle time ("maximum post-exposure CT") is obtained is a layer with the longest expected transfer time of the wafer W to the next layer, this layer becomes a so-called bottleneck in carrying out the transfer of the wafer W in the downstream of the exposure apparatus D5. Then, the maximum post-exposure CT is the expected transfer time, and in the first transfer control and the second transfer control, the carry-out of the wafer W from the exposure apparatus D5 or the carry-in of the wafer W into the exposure apparatus D5 is performed based on this maximum post-exposure CT. In the first transfer control, timing for the carry-out of the wafer W from the exposure apparatus D5 is controlled, and in the second transfer control, timing for the carry-in of the wafer W into the exposure apparatus D5 is controlled. Further, since the MUTCT and the ACT may vary depending on the PJ, the MUTCT and the ACT are calculated for each PJ to determine the maximum post-exposure CT. For a single layer, the larger one of the maximum MUTCT and the ACT corresponds to a section transfer time required to transfer the single sheet of wafer W to the next layer. The MUTCT and the ACT in the single layer correspond to a first candidate and a second candidate of the section transfer time, respectively. In addition, the maximum post-exposure CT corresponds to a maximum section transfer time which is the longest among the section transfer times.

Figure 5:
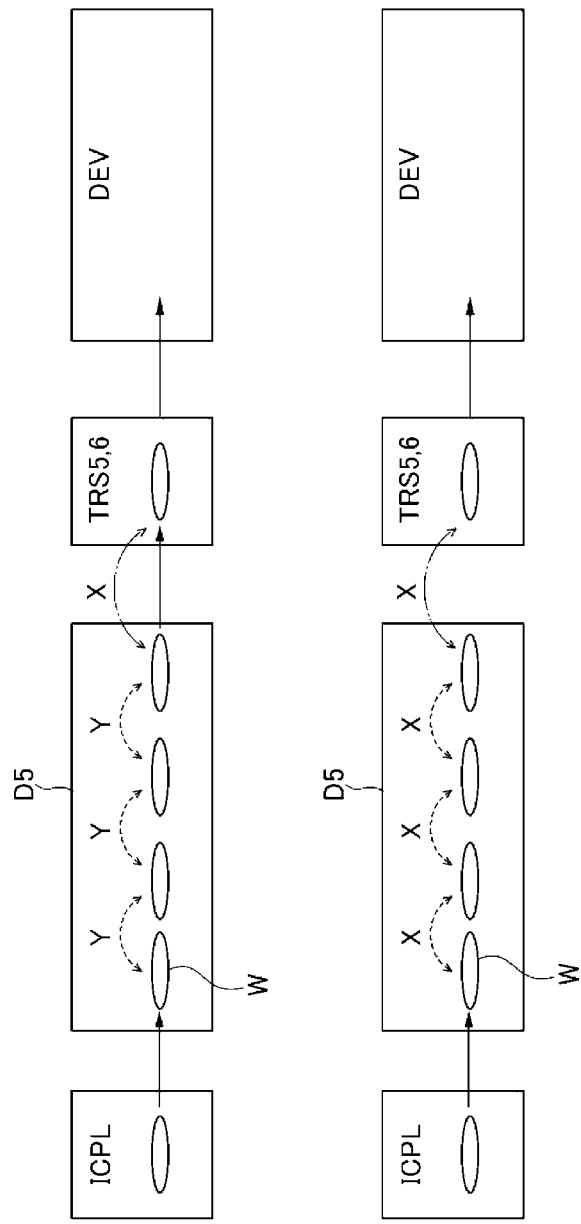
FIG. 5 is an explanatory diagram for describing an outline of a first transfer control and a second transfer control performed in the coating and developing apparatus.
Figure 6:
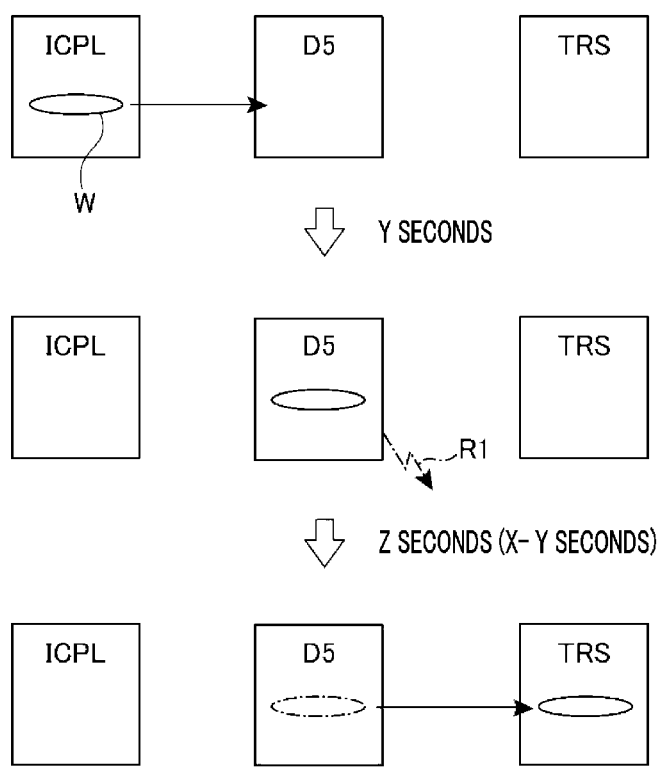
FIG. 6 is a flowchart illustrating a flow of the first transfer control.
Figure 7:
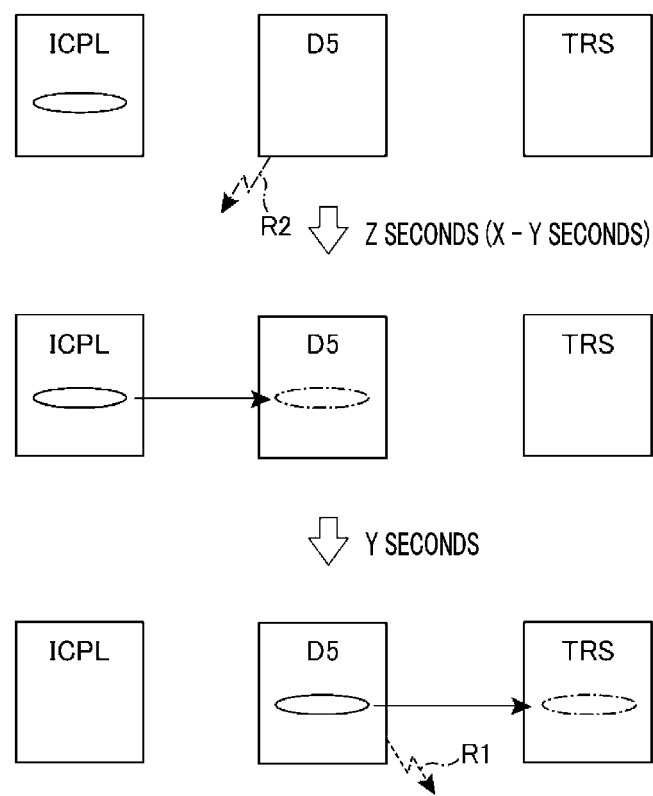
FIG. 7 is a flowchart illustrating a flow of the second transfer control.

The outlines of the first transfer control and the second transfer control are shown in the upper part and the lower part of FIG. 5, respectively. Further, FIG. 6 and FIG. 7 show the outline of the first transfer control and the outline of the second transfer control in a different aspect from FIG. 5. In each drawing, the maximum post-exposure CT is set to X seconds, and the exposure apparatus CT is set to Y seconds. In FIG. 5, dotted-line arrows indicate a carry-in interval at which the wafers W are carried into the exposure apparatus D5 and an interval at which an out-ready signal R1 is outputted, and dashed-line arrows indicate a carry-out interval at which the wafers W are carried out from the exposure apparatus D5.

In the first transfer control, the wafers W are sequentially transferred from the ICPL to the exposure apparatus D5 in the state that the in-ready signal is outputted (upper part of FIG. 6). Then, in the exposure apparatus D5, processing of the wafers W is performed with the Y seconds as one cycle. When the out-ready signal R1 for any one wafer W is outputted (middle part of FIG. 6), the IFBS22 receives this wafer W after Z seconds has elapsed from the output of the out-ready signal R1 (that is, after the wafer W stands by for Z seconds in the exposure apparatus D5), and transfers it to the TRS5 in the downstream (lower part of FIG. 6). This standby time is equal to X seconds–Y seconds (Z seconds=X seconds–Y seconds).

Since the first transfer control is performed as described above, although the carry-in interval at which the wafer W is carried into the exposure apparatus D5 and the interval at which the out-ready signal R1 is outputted are Y seconds, the wafers W are transferred to the DEV layer at an interval of X seconds, as shown in FIG. 5. By this transfer control, the time from the carry-out of the wafer W from the exposure apparatus D5 until the carry-in of the wafer W to the heating module 1A becomes constant or substantially constant between the wafers W, so that the PED time becomes consistent between the wafers W. Further, in this first transfer control, the output interval of the out-ready signal R1 is regarded as the exposure apparatus CT. Thus, in this first transfer control, the carry-out of the wafer W from the exposure apparatus D5 is performed based on the carry-out interval at which the carry-out of the wafer W from the exposure apparatus D5 becomes possible and the maximum exposure apparatus CT.

Meanwhile, in the second transfer control, the IFBS22 receives the wafer W from the ICPL after Z seconds elapses (that is, after the wafer W stands by in the ICPL for Z seconds) from the output of the in-ready signal R2 (upper part of FIG. 7), and transfers the wafer W to the exposure apparatus D5 (middle part of FIG. 7). Here, Z seconds is equal to X seconds–Y seconds. Since the wafer W is transferred later than the output of the in-ready signal R2 in this way, the interval at which the out-ready signal R1 is outputted becomes X seconds, which is longer than the exposure apparatus CT. Then, as soon as the out-ready signal R1 is outputted, the IFBS22 transfers the wafer W to the TRS5 in the downstream (lower part of FIG. 7).

Since the second transfer control is performed as described above, the carry-in interval at which the wafer W is carried into the exposure apparatus D5 and the interval at which the out-ready signal R1 is outputted become X seconds, as described in FIG. 5, and the wafers W are transferred to the DEV layer at an interval of X seconds. For this reason, the interval from the output of the out-ready signal R1 until the transfer of the wafer W to the heating module 1A becomes constant or substantially constant between the wafers W, so that the PED time becomes consistent between the wafers W. Further, in this second transfer control, since the wafer W is promptly transferred after the output of the out-ready signal, the time during which the wafer W after being subjected to the exposure is exposed to the air before being subjected to the PEB can be shortened. Thus, an error in the width of the resist pattern from a design value can be more reliably suppressed.

[Blocking]

Blocking may be performed for a module or a stack constituting a layer as the user designates it through an operation unit of the controller 4. The wafer W is not transferred to the module or stack which is blocked. Since the MSCT and the ACT are calculated based on the number of stacks to be used or the number of modules to be used in the multi-module as stated above, this MSCT is recalculated when the blocking is performed, so the maximum post-exposure CT is reset. In addition to the blocking performed by the user in this way, when a module or a stack becomes unavailable due to detection of a trouble, recalculation is performed in the same way as described above. When the number of modules to be used or the number of available stacks is changed, the maximum post-exposure CT is reset based on the changed number, so that discrepancy in the PED time can be more reliably suppressed. Further, the user may perform blocking of instructing the transfer mechanism to stop its operation through the operation unit of the controller 4. This stop of the operation of the transfer mechanism is referred to as arm blocking.

[Regarding Outline of Third Transfer Control]

The time from an end of the PEB to a start of the development is called PPD (Post PEB Delay) time. Under the situation in which the second transfer control is being performed, the user can select whether or not to enable a third transfer control of suppressing a variation of the PPD time in the same PJ. The shape of the pattern of the wafer W may be changed due to the variation of this PPD time. In particular, when the resist film is composed of a metal-containing resist, there is a concern that the change may be relatively large. The third transfer control may be especially advantageous in this case.

In transferring the respective wafers W of the same PJ, the PRA34 to the PRA36 of the DEV layer operate cyclically to carry out the replacement transfer of the wafers W. A time corresponding to the time during which this one-round moving is performed is referred to as the CT (cycle time) of the DEV layer. Since a single sheet of wafer W is transferred from each stack to the next layer through the one-round moving of each of the PRA34 to the PRA36, the CT of the DEV layer is calculated by dividing the lap time of the PRA34 to PRA36 by the number of stacks (CT of DEV layer=lap time of PRA34 to PRA36/the number of stacks) as stated above.

Here, it is assumed that the exposure apparatus CT is long so there is the bottleneck in performing the transfer. That is, in transferring the wafers W of the single PJ to the DEV layer through the exposure apparatus D5, the MUTCTs (Module Using Time Cycle Time) and the ACT (Arm Cycle Time) calculated in this DEV layer are relatively small. Thus, in the DEV layer, in order to carry out the above-described replacement transfer even if the MUTCTs and the ACT are small, the operations of the PRA33 to the PRA36 are adjusted such that the CT of the DEV layer becomes the exposure apparatus CT, at least until all the wafers W of the corresponding PJ pass through the exposure apparatus D5. Therefore, if the exposure apparatus CT is 50 seconds, the lap time of the PRA34 to the PRA36 is 150 seconds, and the CT of the DEV layer is adjusted to be 50 seconds (150 seconds/the number of stacks (=3)), which is equal to the exposure apparatus CT.

For example, assume that the adjustment of the CT of the DEV layer to the exposure apparatus CT is canceled in order to obtain a high throughput after all the wafers W of the PJ are transferred to the DEV layer through the exposure apparatus D5. That is, it is assumed that the moving speed of the PRA34 to the PRA36 in the DEV layer is changed such that the original CT of the DEV layer (the time corresponding to the larger one of the maximum MUTCT and the ACT in the DEV layer) is obtained. However, in such a case, since a late-order wafer W of the PJ, at least the last wafer W of the PJ is transferred faster in the DEV layer than an early-order wafer W of the PJ, the PPD time becomes non-uniform between the wafers W of the same PJ.

In the third transfer control, for the wafers W of the same PJ transferred in the DEV layer, the CT of the DEV layer is controlled not to be changed until the last wafer W is transferred to the module at the exit of the DEV layer after the first wafer W is transferred thereto, to thereby suppress fluctuation of the PPD time between the wafers W of the corresponding PJ. Assuming that the DEV layer is a multi-stack as described so far, the time during which the PRA moves all the way around in a single stack is maintained after the first wafer W among the wafers W of the PJ supposed to be transferred to the single stack is carried into the corresponding stack until the last wafer W is transferred to the module at the exit.

Also, since the adjustment of the CT of the DEV layer to the exposure apparatus CT is performed depending on conditions, this adjustment may sometimes not be performed. In such a case as well, the CT of the DEV layer does not change and the fluctuation of the PPD time is suppressed until the last wafer W of the same PJ is transferred to the module at the exit of the stack of the DEV layer.

[Description of Different Flows]

Before describing the respective transfer controls in detail, different flows will be explained. Regarding the stages in the downstream of the exposure apparatus D5, PJs which satisfy any one of the following conditions are regarded as different flows. One condition is that the number of stages is different between the preceding PJ and the succeeding PJ. As a specific example, a wafer of one of the PJs may not pass through a module through which a wafer W of the other PJ passes.

Another condition is that modules used in the same stage are different. As a specific example, although the wafer W is transferred to the heating module in the same stage in both of the preceding PJ and the succeeding PJ, the heating module 1A is used in the preceding PJ, whereas the heating module 1B is used in the succeeding PJ. As another example, although the same multi-module is used in the preceding PJ and the succeeding PJ, modules having different numbers (that is, modules located at different places) in the multi-module may be used. As still another condition leading to the different flows, the number of modules to be used in the multi-module is set differently in the preceding PJ and the succeeding PJ. As described above, transfer paths are different for the PJs that become the different flows.

Hereinafter, the individual transfer controls will be explained in detail. In the description, wafers W of a preceding PJ-A and wafers W of a succeeding PJ-B may be assigned reference numerals A1, A2, A3 . . . , and B1, B2, B3 . . . , respectively. English letters represent PJs, and numbers indicate orders in which the wafers W of the single PJ are carried into the apparatus. Further, as will be described later, depending on the PJ concerned, a transfer path that does not include the exposure apparatus D5 may be set. Here, however, it is assumed that the wafers of the respective PJs are transferred through the transfer path H1 including the exposure apparatus D5 as described in FIG. 3 and FIG. 4.

[Details of First Transfer Control]

Below, the first transfer control will be described in detail. In performing the first transfer control, the maximum post-exposure CT is determined. As described so far, the first transfer control is performed to control the timing when the wafer W is carried out from the exposure apparatus D5 according to the bottleneck on the transfer path of this wafer W. For the reason, as a PJ as a calculation target for which MSCT (Max Step Cycle Time) and ACT (Arm Cycle Time) required to determine the maximum post-exposure CT are to be calculated, a PJ to which a PJ to be carried out from the exposure apparatus D5 belongs (for convenience of explanation, referred to as a carry-out PJ), or a PJ prior to the carry-out PJ, not finished, and passing through one of the layers through which the carry-out PJ passes in the downstream of the exposure apparatus D5. This preceding PJ is not limited to being one, but may be plural in number.

In addition, the calculation of the MUTCT (Module Using Time Cycle Time) and the ACT, which are the basis of MSCT, will be elaborated. Regarding the layers, the layer through which the carry-out PJ passes in the downstream of the exposure apparatus D5 becomes the calculation target for the purpose of performing the transfer according to the bottleneck. Therefore, the IFBS layer, the IFB layer, the DEV layer, the MPRA layer, and the CRA layer are the target layers. The wafer W of the PJ as the calculation target exists, and the MUTCT and the ACT are calculated from the layer as the calculation target. Then, among the ACTs obtained from the respective layers and the MSCT, which is the maximum value of the MUTCTs obtained from the respective layers, the maximum value is determined as the maximum post-exposure CT. In response to the out-ready signal outputted from the exposure apparatus D5, such determination of the maximum post-exposure CT and acquisition of the exposure apparatus CT from the out-ready signal are performed.

Regarding this exposure apparatus CT, the interval between the timing at which the current out-ready signal R1 is outputted and the timing at which the immediately previous out-ready signal R1 is outputted is acquired as the exposure apparatus CT. Then, the exposure apparatus CT and the maximum post-exposure CT are compared, and it is determined whether or not to suppress the carry-out of the wafer W from the exposure apparatus D5. When performing the suppression of the carry-out, a standby time in the exposure apparatus D5 from when the out-ready signal R1 is outputted until the transfer from exposure apparatus D5 is performed is determined. This standby time corresponds to the Z seconds mentioned in FIG. 6, and it is a time corresponding to a difference between the exposure apparatus CT and the maximum post-exposure CT.

Figure 8:
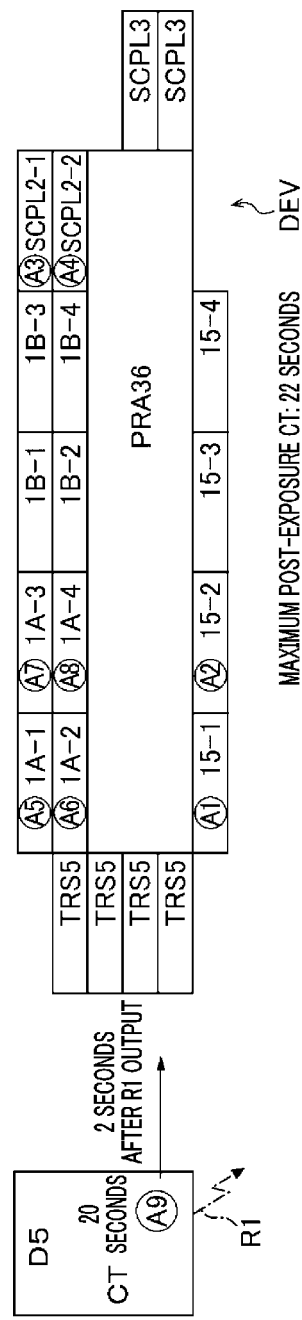
FIG. 8 is a schematic diagram illustrating a DEV layer in the coating and developing apparatus for showing an example of the first transfer control.

FIG. 8 shows a state in which the wafers W of the PJ-A are transferred in the DEV layer after passing through the exposure apparatus D5 sequentially. It is assumed that the out-ready signal R1 is outputted from the exposure apparatus D5, and a wafer A9 is carried out from the exposure apparatus D5. Assuming that the interval between the output of the out-ready signal R1 and the output of an out-ready signal outputted immediately before (i.e., the interval between the outputs of the out-ready signals for a wafer A8 and the wafer A9) is 20 seconds, this 20 seconds is regarded as the exposure apparatus CT. It is also assumed that the maximum post-exposure CT obtained at a time point when the out-ready signal R1 of the wafer A9 is outputted is 22 seconds.

That is, in the situation shown in FIG. 8, the maximum post-exposure CT is larger than the exposure apparatus CT (maximum post-exposure CT>exposure apparatus CT). When the maximum post-exposure CT and the exposure apparatus CT is in such a relationship, there is made a decision that the suppression of the carry-out of the wafer W from the exposure apparatus D5 is to be performed. In addition, upon the lapse of a time corresponding to the difference between the exposure apparatus CT and the maximum post-exposure CT from the output of the out ready signal R1 to the wafer A9, there is made a determination that the wafer A9 is to be carried out from the exposure apparatus D5. Therefore, specifically, in the situation of FIG. 8, the operation of the IFBS22 is controlled so that the wafer A9 is carried out from the exposure apparatus D5 after 2 seconds (22 seconds−20 seconds) after the out-ready signal R1 is outputted.

In the situation shown in FIG. 8, among the layers in the downstream of the exposure apparatus D5, there is a layer that requires 22 seconds, which is longer than the 20 seconds of the exposure apparatus CT, to transfer the single sheet of wafer W to the next layer. If the wafer A9 is carried out from the exposure apparatus D5 immediately after the output of the out-ready signal R1, there is a risk that the wafer A9 may stay on the transfer path before it is transferred to the heating module 1A of the DEV layer. For this reason, the carry-out of the wafer A9 from the exposure apparatus D5 is delayed.

Figure 9:
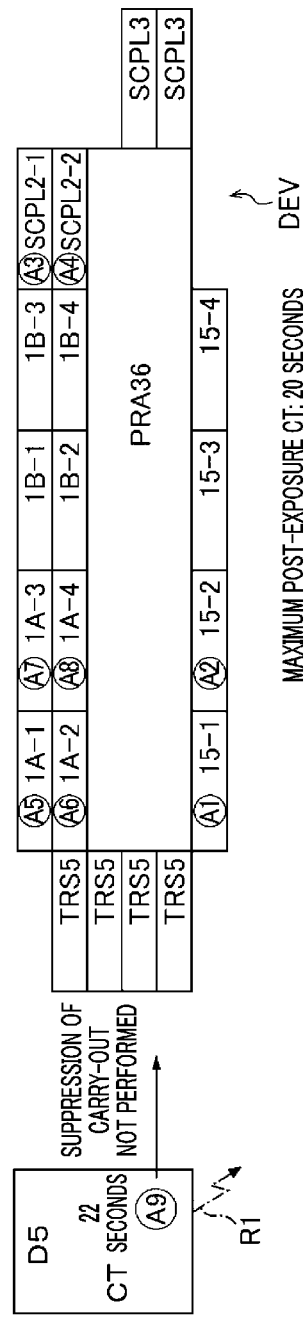
FIG. 9 is a schematic diagram illustrating the DEV layer for showing an example of the first transfer control.

FIG. 9 is different from the situation described in FIG. 8 in that the exposure apparatus CT is 22 seconds and the obtained maximum post-exposure CT is 20 seconds. Therefore, in FIG. 9, the maximum post-exposure CT is smaller than the exposure apparatus CT (maximum post-exposure CT<exposure apparatus CT). In this relationship, as soon as the out-ready signal R1 is outputted, the IFBS22 receives the wafer A9 and transfers it to the subsequent TRS. That is, the suppression of the carry-out of the wafer W from the exposure apparatus D5 after the output of the out-ready signal R1 described in FIG. 8 is not performed. This is because the exposure apparatus D5 is the bottleneck of the transfer so the retention of the wafer W in the downstream of the exposure apparatus D5 is suppressed. Moreover, for the same reason as stated above, the suppression of the carry-out of the wafer W from exposure apparatus D5 is not performed when the maximum post-exposure CT is equal to the exposure apparatus CT (maximum post-exposure CT=exposure apparatus CT).

Figure 10:
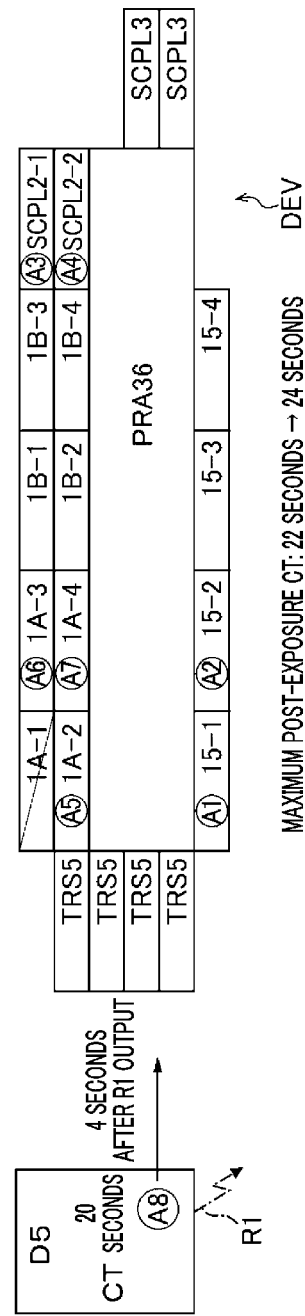
FIG. 10 is a schematic diagram illustrating the DEV layer for showing an example of the first transfer control.

FIG. 10 is different from the state described in FIG. 8 in that the maximum post-exposure cycle time is changed from 22 seconds to 24 seconds due to blocking of a heating module 1A-1. Since recalculation is performed due to the blocking, there is a change in the maximum post-exposure CT from the state of FIG. 8. In the state of FIG. 10, since the maximum post-exposure CT is larger than the exposure apparatus CT (maximum post-exposure CT>exposure apparatus CT), the same as in the state of FIG. 8, the carry-out of the wafer W from the exposure apparatus D5 is suppressed, and the wafer W is carried out from the exposure apparatus D5 after the lapse of a time corresponding to the difference between the maximum post-exposure CT and the exposure apparatus CT (maximum post-exposure CT−exposure apparatus CT) from the output of the out-ready signal R1. Specifically, after the output of the out-ready signal R1, the wafer W is carried out from the exposure apparatus D5 upon the lapse of 4 seconds (24 seconds−20 seconds).

Figure 11:
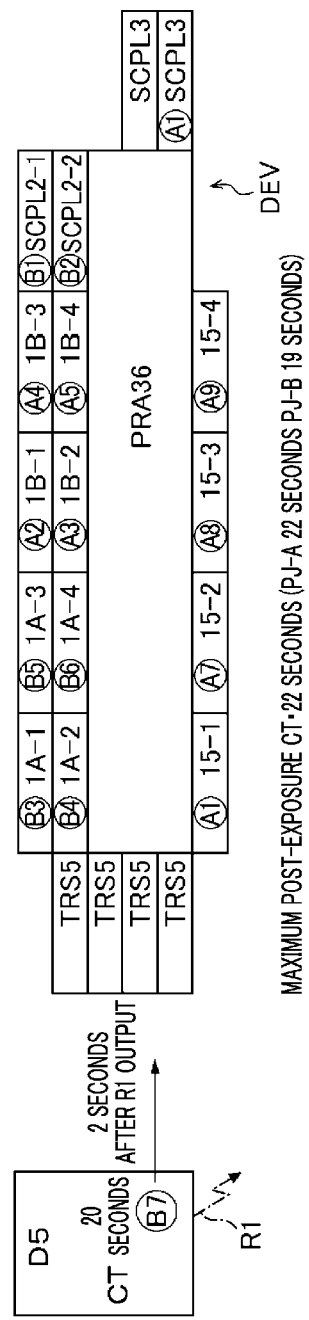
FIG. 11 is a schematic diagram illustrating the DEV layer for showing an example of the first transfer control.

FIG. 11 illustrates a state in which the PJ-A and the PJ-B are being transferred in one stack of the DEV layer; a wafer B7 is to be carried out from exposure apparatus D5; and the exposure apparatus CT is 20 seconds. Since the PJ-A and the PJ-B are transferred through the same transfer path H1, the ACT (Arm Cycle Time) of the DEV layer is the same therebetween. However, maximum values of the MUTCTs (Module Using The maximum value of Time Cycle Time) are different between the PJ-A and the PJ-B. The maximum time from the MUTCTs and the ACT of the DEV layer for the PJ-A is 22 seconds, whereas the maximum time from the MUTCTs and the ACT of the DEV layer for the PJ-B is 19 seconds. Further, it is assumed that all of the MUTCTs and the ACTs acquired from respective layers other than the DEV layer in the downstream of the exposure apparatus D5 are all smaller than 19 seconds.

In this case, the maximum post-exposure CT is determined as 22 seconds, which is calculated from the PJ-A according to the rule described above. Then, since the maximum post-exposure CT is larger than the exposure apparatus CT (maximum post-exposure CT−exposure apparatus CT), the carry-out of the wafer B7 from the exposure apparatus D5 is suppressed, and the wafer B7 is carried out from the exposure apparatus D5 after the lapse of 2 seconds (22 seconds−20 seconds) from the output of the out-ready signal R1. In this way, when there is a plurality of PJs (that is, a plurality of lots of wafers W) in one layer, MUTCTs are calculated for each PJ, and the maximum post-exposure CT is determined therefrom.

Figure 12:
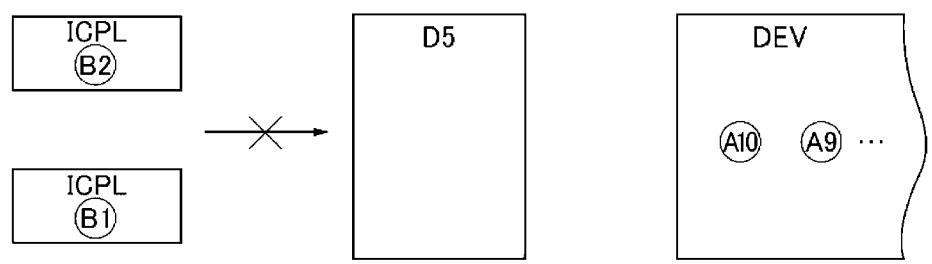
FIG. 12 is a schematic diagram illustrating the DEV layer for showing an example of the first transfer control.

FIG. 12 illustrates a state in which the PJ-A and the PJ-B are different flows, and the PJ-A is being transferred through the respective layers in the downstream of the exposure apparatus D5, including the DVE layer. In this case, the PJ-B is not transferred to the exposure apparatus D5, but it stands by in a module in an upstream of the exposure apparatus D5. That is, each wafer W of the PJ-B is transferred to the ICPL, which is a module immediately before the exposure apparatus D5, but is not transferred to the exposure apparatus D5. When all the wafers W of the PJ-A are stored in the carrier C and the PJ-A is finished, the wafers W of the PJ-B are sequentially transferred to the exposure apparatus D5 and the downstream thereof to be subjected to the transfer control as described so far.

If the PJs as the different flows are mixed in the downstream of the exposure apparatus D5, there is a risk that that a comparatively large variation of the PED time may be caused because a transfer operation of each transfer mechanism changes as the PJ are switched. In order to prevent such a variation, when the preceding PJ (first lot) and the succeeding PJ (second lot) have a relationship of being the different flows, the succeeding PJ is not transferred to the exposure apparatus D5 until the preceding PJ is finished.

[Details of Second Transfer Control]

Figure 13:
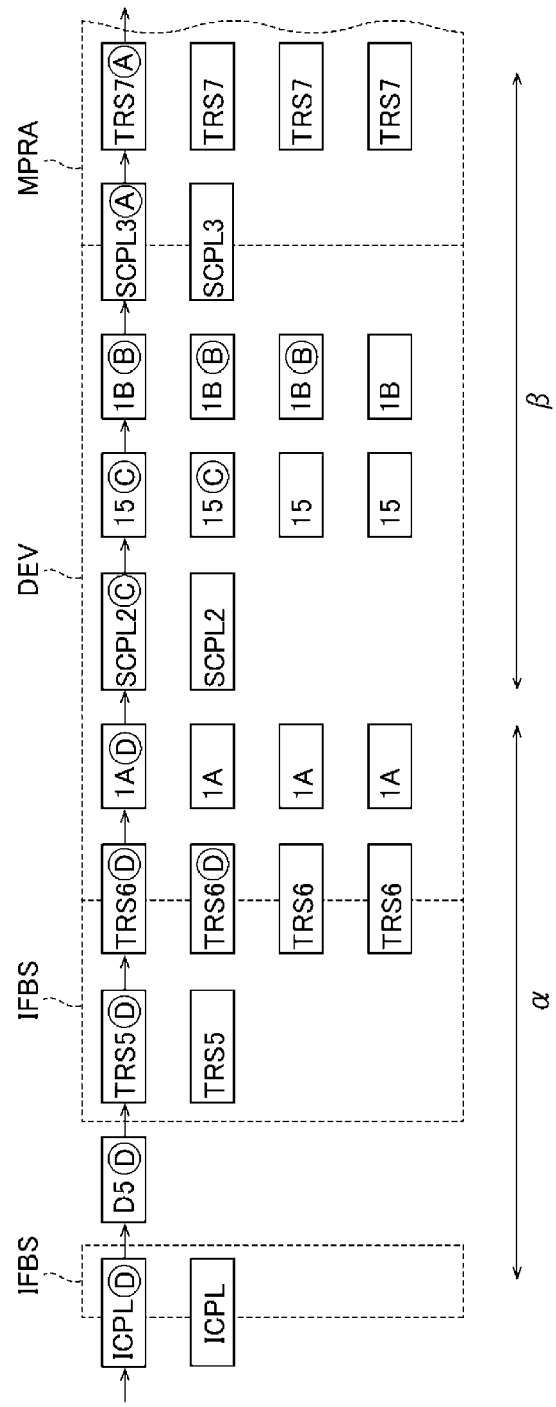
FIG. 13 is an explanatory diagram showing PJ related to the second transfer control.

Now, the second transfer control will be discussed in detail. In performing the second transfer control, the maximum post-exposure CT is also determined. As stated above, the second transfer control is performed to control the transfer interval of wafers from the exposure apparatus D according to the bottleneck in the transfer path of the wafers W in the downstream of the exposure apparatus D5, in the same way as in the first transfer control. For this reason, as a PJ for which MUTCT (Module Using Time Cycle Time) and ACT (Arm Cycle Time) required to determine the maximum post-exposure CT are to be calculated, wafers W suitable for the following condition α or condition β may be used. Further, the PJ suitable for the condition β is not limited to one, the same as in the first transfer control. In FIG. 13, PJs set for the wafers W are designated as A, B, C, and D in the order of being processed, and the PJA to the PJD are matched with the conditions α and β. PJ-D is suitable for the condition α, and PJ-A to PJ-C are suitable for the condition β.

Condition α: a PJ to which a PJ scheduled to be carried into the exposure apparatus D5 next time belongs (for convenience of explanation, referred to as a carry-in PJ)

Condition β: a PJ prior to the carry-in PJ, not finished, and passing through any layer through which the carry-in PJ passes after the exposure apparatus D5

Further, a layer through which the carry-in PJ passes in the downstream of the exposure apparatus D5 becomes a calculation target of MUTCT and ACT for the purpose of performing the transfer according to the bottleneck. In the second transfer control, a wafer W of the PJ as the calculation target exists, and the MUTCT and the ACT are calculated from the layer as the calculation target, and the maximum value among them is determined as the maximum post-exposure CT, the same as in the first transfer control.

To explain this decision in more detail, all of the PJ-A to the PJ-D shown in FIG. 13 are transferred through the transport path H1, and a wafer W of the PJ-D is located in the ICPL. That is, this wafer W of the PJ-D corresponds to the wafer W scheduled to be carried into the exposure apparatus D5 next, and transfer destinations of this wafer W of the PJ-D, that is, the IFBS layer, the DEV layer, and the MPRA layer, and the CRA layer are layers as the calculation target. Among them, if wafers W of the PJ-A to the PJ-D are located in the IFBS layer, the DEV layer, and the MPRA layer and no wafer W is located in the CRA layer, the MUTCT and the ACT are calculated from the IFBS layer, DEV layer, and the MPRA layer, and the maximum post-exposure CT is determined therefrom. The determination of the maximum post-exposure CT described above is also performed in the first transfer control in the same way.

Figure 14:
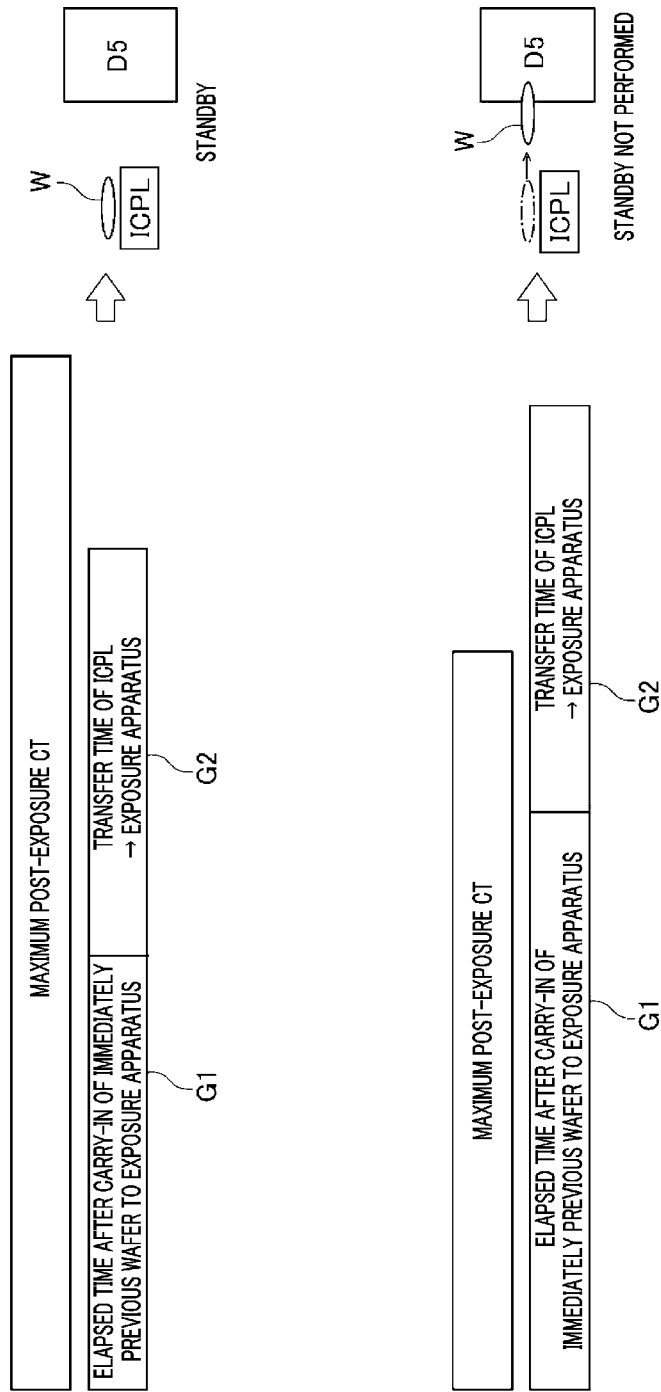
FIG. 14 is an explanatory diagram related to the second transfer control.

Then, in the state that the in-ready signal is outputted from the exposure apparatus D5 and the wafer W is placed in the ICPL, the maximum post-exposure CT is calculated. When the time elapsed after transferring the wafer W to the exposure apparatus D5 immediately before is defined as G1, and the time required to transfer the wafer W from the ICPL to the exposure apparatus D5 is defined as G2, a total time of G1 and G2 is calculated, and a comparison is made between this total time (G1+G2) and the maximum post-exposure CT. As a result of the comparison, if the maximum post-exposure CT is larger than the total time (G1+G2) (maximum post-exposure CT>total time (G1+G2)) (as shown in the upper part of FIG. 14), there is made a determination that the wafer W in the ICPL is to be put on standby in the ICPL. Further, since parameters for calculating the time G2 (the time required for the transfer mechanism 22 to move between the exposure apparatus D5 and the ICPL, and the time required to deliver the wafer W to each of the exposure apparatus D5 and the ICPL through forward/backward movements of the substrate holder of the transfer mechanism 22) are stored in the controller 4, the time G2 can be calculated. In addition, the controller 4 also stores the time when the in-ready signal is outputted, and can acquire the time G1.

In case that it is determined that the wafer W is put on standby in the ICPL, a standby-time in the ICPL is calculated by subtracting the time G1 and the time G2 from the maximum post-exposure CT (maximum post-exposure CT−time G1−time G2). That is, the wafer W stands by in the ICPL for a time corresponding to a difference between the maximum post-exposure CT and the sum of the time G1 and the time G2. Further, the standby time calculated in this way corresponds to the Z seconds described in FIG. 7. In this way, by calculating the standby time as a time based on the maximum post-exposure CT, the interval at which the wafer W is carried out from the exposure apparatus D5 is adjusted in the same manner as in the case of performing the first transfer control, so that the wafer W is suppressed from staying before being subjected to the PEB.

Meanwhile, when the maximum post-exposure CT is found to be equal to or less than the sum of the time G1 and the time G2 (maximum post-exposure CT time G1+time G2), the wafer W is transferred to the exposure apparatus D5 without standing by in the ICPL. In an example shown in the lower part of FIG. 14, the standby in the ICPL is not performed because the maximum post-exposure CT is smaller than the sum of the time G1 and the time G2 (maximum post-exposure CT<time G1+time G2). As for the reason why the standby is not performed in this way, since the exposure apparatus D5 is the bottleneck of the transfer (that is, since any module in the downstream of the exposure apparatus D5 is not the bottleneck), the wafer W carried out from the exposure apparatus D5 is expected not to suffer the staying in the transfer path until it reaches the heating module 1A for PEB.

[Conditions for Stopping Transfer to Exposure Apparatus]

Even during the second transfer control, in order to more reliably suppress the fluctuation of the PED time, when a preceding PJ and a succeeding PJ are different flows, the wafers W of the succeeding PJ are not transferred to the exposure apparatus D5 until all the wafers W of the preceding PJ are transferred to the exposure apparatus D5 and the processing of the preceding PJ is finished, the same as in the first transfer control. Therefore, as shown in FIG. 12, when the PJ-A and the PJ-B are different flows and the wafers of the PJ-A are being transferred through layers in the downstream of the exposure apparatus D5 including the DEV layer, the wafers W of the PJ-B are transferred to the ICPL, which is a module immediately before the exposure apparatus D5, but are not transferred to the exposure apparatus D5. The wafers W of the PJ-B are sequentially transferred to the exposure apparatus D5 after the PJ-A is finished.

Further, during the second transfer control, if a stage and/or a layer through which the wafer W located in the ICPL passes in the downstream of the exposure apparatus D5 satisfies any one of the following conditions 1 to 4, a transfer of the corresponding wafer W to the exposure apparatus D5 is not performed. The condition 1 is a case where an arm blocking instruction is given to the transfer mechanisms of all the stacks of the multi-stack. Specifically, this may be a case where an arm blocking instruction is made to all of the PRA34 to the PRA36 of the three stacks of the DEV layer. The condition 2 is a case where, although the arm blocking is not instructed, all modules at the same stage in the same layer are not available. Specifically, when processing the wafer W by transferring it through the above-described transfer path H1, there may be assumed a case where all the developing modules 15 in the DEV layer (that is, all the developing modules 15 in the three stacks) are unusable. This case corresponds to the condition 2.

Before explaining the conditions 3 and 4, a bypass target module and an inspection module will be described. A bypass target module is defined as a module set to allow, when it becomes unavailable, a wafer W to be transferred to a module at the downstream thereof without passing through that unavailable module. A module incapable of performing such a transfer is set as a non-bypass-target module. In other words, the bypass target module is a module to which the wafer W is allowed not to be transferred, but it is assumed that all the modules on the above-described transfer path H1 are non-bypass-target modules. Further, the coating and developing apparatus 1 may be equipped with an inspection module mounted to a certain layer such as the DEV layer to perform predetermined inspection by imaging the wafer W. Since the inspection module is provided to perform the inspection, a transfer of the wafer W to the inspection module may be omitted when the inspection is not required. The condition 3 is a case where all non-bypass-target modules in a certain stage are unavailable in the downstream of the exposure apparatus D5 in the state that module blocking is not instructed. The condition 4 is a case where the transfer cannot be performed to all non-bypass-target modules other than the inspection module in a certain stage in the downstream of the exposure apparatus D5.

As described above, the conditions 1 to 4 as set such that, if the wafer W located in the ICPL cannot be transferred to a layer through which the wafer W is scheduled to pass and/or a module through which the wafer W is scheduled to pass but is transferred to the exposure apparatus D5, for example, a transfer of the wafer W into the exposure apparatus D5 is stopped in case that the transfer should be stopped in the downstream of the exposure apparatus D5. That is, when the wafer W cannot be transferred between one module in the downstream of the exposure apparatus and another module in the downstream of that one module, the wafer W is not transferred to the exposure apparatus D5. If none of the aforementioned conditions 1 to 4 applies and the state in which the transfer should be stopped is resolved, the wafer W is transferred to the exposure apparatus D5 from the ICPL.

[Further Explanation of Layer as Target of Parameter Calculation]

In performing the second transfer control, when the preceding PJ is a different flow from the succeeding PJ, it has been described that the succeeding PJ is not transferred to the exposure apparatus D5. However, the user can select whether or not to stop the transfer to the exposure apparatus D5 due to the existence of this different flow. More specifically, even if layers and/or modules through which wafers are supposed to pass are different between the preceding PJ and the succeeding PJ, the succeeding PJ can be set to be transferred to the exposure apparatus D5 before the end of the preceding PJ. This setting is referred to as different flow permission setting. Through this different flow permission setting, the succeeding PJ need not stand by in the exposure apparatus D5 until the preceding PJ is finished, so that the throughput can be improved. In case that the succeeding PJ passes through the respective layers described in the transfer path H1, and the wafer W of this succeeding PJ is transferred to the ICPL, a layer as a target for which MUTCT and ACT required to obtain the maximum post-exposure CT for the second transfer control are to be calculated will be further explained.

Here, it is assumed that the preceding PJ passes through the same layers as the transfer path H1, or are transferred through the following transfer paths H2 to H5 specified below. Further, processing modules used in the preceding PJ are not limited to the processing modules of the same types as those used in the transfer path H1, and wafers W may not pass through some of the modules, or may pass through a module which is not described in FIG. 1, etc.

Transfer path H2: carrier C→CRA layer→MPRA layer→COT layer→IFB layer→IFBS layer→IFBS layer→IFB layer→DEV layer→MPRA layer→CRA layer→carrier C Transfer path H3: carrier C→CRA layer→MPRA layer→COT layer→IFB layer→IFB layer→DEV layer→MPRA layer→CRA layer→carrier C Transfer path H4: carrier C→CRA layer→MPRA layer→COT layer→MPRA layer→CRA layer→carrier C Transfer path H5: carrier C→CRA layer→MPRA layer→DEV layer→MPRA layer→CRA layer→carrier C In this way, even when the transfer paths are different between the preceding PJ and the succeeding PJ, the layer through which a wafer W to be transferred to the exposure apparatus D5 next is supposed to pass becomes an acquisition target layer for which the MUTCT and the ACT are acquired, in view of the foregoing that the standby in the ICPL is performed according to the bottleneck in the transfer path of the wafer W in the downstream of the exposure apparatus. Therefore, acquisition target layers are the IFBS layer, the IFB layer, the DEV layer, the MPRA layer, and the CRA layer when the preceding PJ is transferred through the transfer paths H1 and H2; the acquisition target layers are the IFB layer, the DEV layer, the MPRA layer, and the CRA layer when the preceding PJ is transferred through the transfer path H3; and the acquisition target layers are the MPRA layer and the CRA layer when the preceding PJ is transferred through the transfer path H4; and the acquisition target layers are the IFB layer, the DEV layer, the MPRA layer, and the CRA layer when the preceding PJ is transferred through the transfer path H4.

Even if the different flow permission setting is made as described above, the MUTCT and the ACT of each PJ are acquired from each layer as the target of calculation as described above, so the maximum post-exposure CT is determined. According to the calculated maximum post-exposure CT, the wafer W stands by in the ICPL. When this different flow permission setting is performed, even if there exists a preceding PJ whose bottleneck is a stage through which a wafer W of the succeeding PJ is not supposed to pass, it is possible to prevent the fluctuation of the PED time that might be caused by a state in which the succeeding PJ fails to overtake the preceding PJ and stands by at the entrance of the DEV layer.

Although the conditions 1 to 4 for stopping the transfer to the exposure apparatus D5 and the different flow permission setting have been described with regard to the second transfer control, they are also applied to the first transfer control. That is, in performing the first transfer control, if any one of the conditions 1 to 4 is satisfied, the transfer of the wafers W to the exposure apparatus D5 is stopped. Further, in performing the first transfer control, the wafers W of the succeeding PJ can be set to be transferred to the exposure apparatus D5 before the end of the processing of the PJ which is different from the succeeding PJ in terms of layers or modules through which wafers are transferred.

[Description of Third Transfer Control]

Now, the third transfer control will be explained. In performing this third transfer control, the exposure apparatus CT is set in advance. In the description of the first transfer control, the output interval of the out-ready signal is described as being regarded as the exposure apparatus CT. However, in order to control the PPD time with higher precision, it is desirable to use a previously prepared set value as the exposure apparatus CT or to acquire the exposure apparatus CT from the exposure apparatus D5. In case of acquiring the exposure apparatus CT from the exposure apparatus D5, the controller 4 of the coating and developing apparatus 1 may acquire it through a host computer which controls the controller 4 and a non-illustrated controller of the exposure apparatus D5, when the processing is started in the coating and developing apparatus 1, for example.

In the state that the user has made a selection to perform the third transfer control, the above-described second transfer control is performed. For example, when a certain PJ is transferred through the transfer path H1, the CT of the DEV layer of this PJ and the exposure apparatus CT are compared before the PJ is carried into the exposure apparatus D5. Here, the CT of the DEV layer is the maximum value among the ACT in the DEV layer designated by the PJ and the MUTCTs obtained from modules other than those at the entrance and the exit of the DEV layer. Hereafter, it may be expressed as an original CT of the DEV layer. In addition, the original CT of the DEV layer is the time calculated from the lap time of the PRA34 to PRA36 and the number of stacks as stated so far, and corresponds to a section transfer time corresponding to a predetermined lap time of the PRA set by the PJ in advance. In the transfer of the wafer W, this original CT of the DEV layer may not always be set, so the original CT of the DEV layer is just a candidate value that can be calculated by the controller 4 and can be set as the CT of the DEV layer. The exposure apparatus CT is also a candidate value that can be set as the CT of the DEV layer, like the original CT of the DEV layer.

Figure 15:
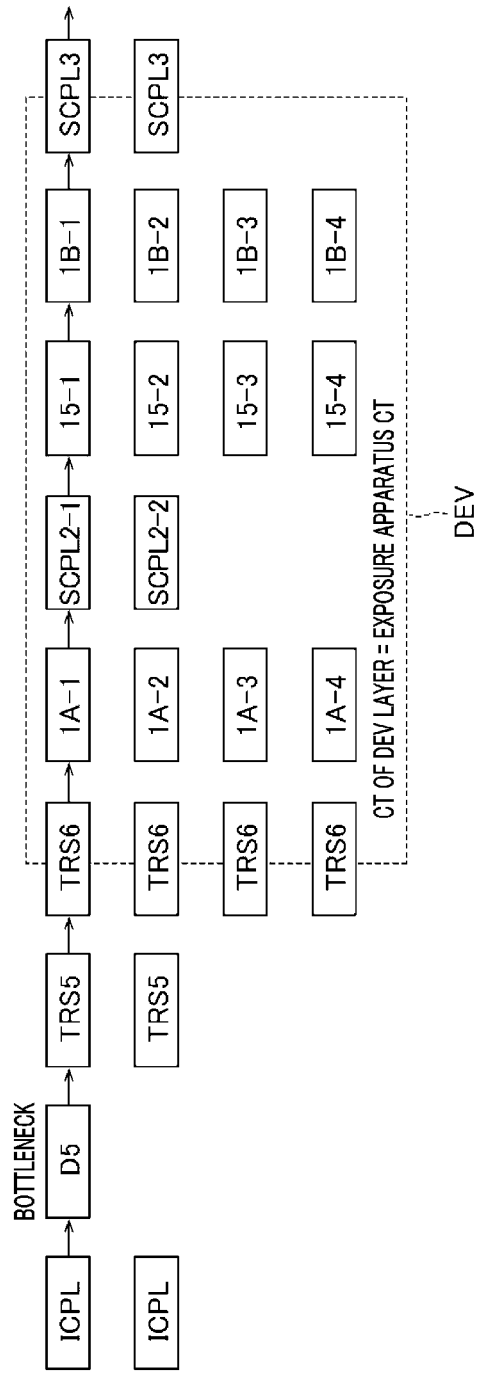
FIG. 15 is an explanatory diagram related to a third transfer control performed in the coating and developing apparatus.

As a result of the comparison, when the exposure apparatus CT is longer (exposure apparatus CT>CT of the DEV layer), the exposure apparatus D5, among the exposure apparatus D5 and the DEV layer in the downstream of the ICPL, becomes the bottleneck of the transfer. In this case, the wafer W of the above-described PJ is carried into the DEV layer via the ICPL and the exposure apparatus D5. In the DEV layer, the wafer W is transferred toward the SCPL3, which is the module at the exit, in the state that the CT of the corresponding DEV layer, which is the section transfer time, is adjusted to the exposure apparatus CT (FIG. 15). Therefore, the wafer W of this PJ is transferred in the DEV layer with a CT longer than the original CT of the DEV layer. More specifically, the PRA34 to the PRA36 of the DEV layer move around at a time different from the time predetermined by the PJ to perform the transfer in the DEV layer. As described above, the CT of the DEV layer does not change until, among the wafers W of the same PJ, at least the last wafer W transferred in the DEV layer is transferred to the SCPL3 (that is, until the transfer of the corresponding PJ in the DEV layer is ended). Depending on a PJ that follows, the CT of the DEV layer is maintained as the exposure CT.

Furthermore, since the second transfer control is being performed while the transfer is carried out as described above, the calculation described in FIG. 14 is performed when the wafer W is transferred from the ICPL to the exposure apparatus D5, so that the standby of the wafer W in the ICPL is performed appropriately. However, since the exposure apparatus D5 is the bottleneck of the transfer so the output interval of the in-ready signal is relatively long, there is found a tendency that the maximum post-exposure CT is larger than the sum of the time G1 and the time G2 (maximum post-exposure CT>time G1+time G2) at the timepoint when the in-ready signal is outputted. For this reason, the standby of the wafer W in the ICPL tends to be difficult to perform.

By carrying out the transfer control as described above, all the wafers W of the same PJ are transferred in the DEV layer at a regular interval. Thus, the PPD time is consistent between the wafers W of the corresponding PJ. Further, since the exposure apparatus cycle time (that is, the carry-out interval of the wafers W from the exposure apparatus D5) and the cycle time of the DEV layer are the same, the respective wafers W are transferred to the heating module 1A at a regular interval. Therefore, the PED time is also consistent between the wafers W of the same PJ.

Figure 16:
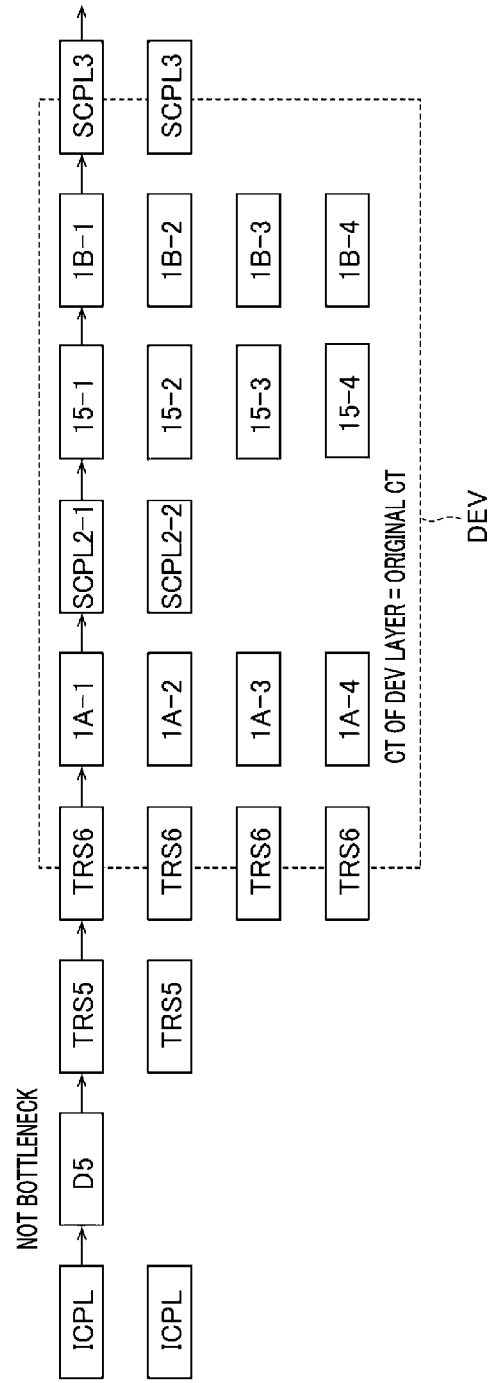
FIG. 16 is an explanatory diagram for describing the third transfer control.

Meanwhile, as a result of the comparison between the exposure apparatus CT and the CT of the DEV layer for the PJ before being carried into the exposure apparatus D5, when the exposure apparatus CT is found to be longer (exposure apparatus CT CT of the DEV layer), the DEV layer among the exposure apparatus D5 and the DEV layer becomes the bottleneck of the transfer. In this case, the wafer W of the above-described PJ is carried into the DEV layer via the ICPL and the exposure apparatus D5, and in the DEV layer, the wafer W is transferred toward the SCPL3, which is the module at the exit, with the original CT of the DEV layer (FIG. 16). That is, adjustment of the CT of the DEV layer to the exposure apparatus CT is not performed. In this case as well, since the second transfer control is being performed, the standby of the wafer W in the ICPL is appropriately performed due to the calculation described in FIG. 14.

Since the second transfer control is performed as described above, the carry-out interval of the wafers W from the exposure apparatus D5, and, besides, the carry-in interval of the wafers W into the DEV layer are constant or substantially constant. In the DEV layer, since the wafers W are sequentially transferred at the regular interval (the original CT of the DEV layer), the PED time and the PPD time are consistent between the wafers W even in this case. In this way, even when the wafers W are transferred with the original CT of the DEV layer, the CT of the DEV layer does not change until, among the wafers W of the same PJ, the last wafer W transferred in the DEV layer is transferred to the module at the exit of the DEV layer.

[Restrictions in Carrying Wafers into Exposure Apparatus]

In the setting in which the third transfer control is performed, if the preceding PJ and the succeeding PJ are different flows, the wafers W of the succeeding PJ are not transferred to the exposure apparatus D5 until the preceding PJ is finished, and they are sequentially transferred to the exposure apparatus D5 from the ICPL after the end of the preceding PJ, as explained in the first transfer control and the second transfer control. Therefore, the wafer W transferred to the ICPL stands by in the ICPL until the preceding PJ is finished. This is for the same reason for preventing the transfer of the succeeding PJ of the different flow into the exposure apparatus D5 as described in the first transfer control and the second transfer control. That is, if the wafers W of the succeeding PJ are transferred to the exposure apparatus D5 before the preceding PJ is finished, the wafers W of the succeeding PJ may be kept on standby at the entrance of the DEV layer, resulting in the increase of the PED time.

Further, when the CT of the DEV layer is changed between the preceding PJ and the succeeding PJ, the wafers W of the succeeding PJ are not transferred to the exposure apparatus D5, either. That is, the wafers W of the preceding PJ are not transferred to the exposure apparatus D5 until the preceding PJ is finished. This is because, since the wafers W of the preceding PJ from its first one to the last one are transferred in the DEV layer at a constant cycle, the succeeding PJ having a different CT of the DEV layer cannot be transferred in the DEV layer in the meanwhile.

As a specific example, it is assumed that transfer is being performed with the CT of the DEV layer adjusted to the exposure apparatus CT when there is a relationship of exposure apparatus CT>maximum post-exposure CT for the preceding PJ. Also, it is assumed that there is a relationship of CT of the DEV layer>exposure apparatus CT for the succeeding PJ transferred to the ICPL. In other words, when transferring the succeeding PJ in the DEV layer, the adjustment of the CT is not performed, so the CT of the DEV layer changes. For this reason, the succeeding PJ is not transferred to the exposure apparatus D5 until the preceding PJ is finished. For another example, it is assumed that transfer is being performed with the original CT of the DEV layer for the preceding PJ, and the CT of the DEV layer of the succeeding PJ transferred to the ICPL is set to be different from the CT of the DEV layer of the preceding PJ. In this case as well, since the CT of the DEV layer is changed for the transfer of the succeeding PJ in the DEV layer, the succeeding PJ is not transferred to the exposure apparatus D5 until the preceding PJ is finished. In this way, when there is a change in the lap time of the PRA34 to the PRA36 in the DEV layer from the lap time in the transfer of the preceding PJ, the transfer of the succeeding PJ to the exposure apparatus D5 is stopped.

[Regarding Restrictions on the Number of Modules Used]

For example, it is assumed that all modules of the multi-module of a certain stage are used in one stack of the DEV layer. In this case, the wafer W transferred to one module in the multi-module is transferred to a module next to that multi-module after the cycle of the DEV layer (that is, one lap of the PRA) is performed as much as the number of the modules belonging to the multi-module. Therefore, the wafer W stays in that one module for an amount of time equivalent to the product of the CT of the DEV layer and the number of the modules belonging to the multi-module (CT of the DEV layer×number of modules in the multi-module). Specifically, as shown in FIG. 15 and FIG. 16, since four heating modules 1A-1 to 1A-4 are provided as the heating module 1A, the wafer W transferred to the heating module 1A-1 is sent to the next SCPL2 after four cycles elapse. In case that the adjustment of the CT of the DEV layer described in FIG. 15 and the like is performed, the wafer W stays in the heating module 1A-1 for a time equivalent to the product of the exposure apparatus CT and the time corresponding to the four cycles (exposure apparatus CT×time of the four cycles).

The CT of the DEV layer is prolonged from the original CT by being adjusted to the exposure apparatus CT. Therefore, the time during which the wafer W stays in each module is prolonged, causing the PPD time to be increased as well. In order to suppress such an increase of the PPD time, the number of modules used in the multi-module in the DEV layer may be restricted at the time when the adjustment of the CT is performed. More specifically, it is possible to limit the number of modules in each stage except for the modules at the entrance and the exit of the DEV layer may be restricted, and this restriction is performed such that the number of modules used becomes a minimum number (necessary number of modules) required to perform the transfer in the DEV layer with the exposure apparatus CT. That is, in each stage of the DEV layer, the minimum number of modules enabling a transfer of a single sheet of wafer W to the next stage per cycle of the DEV layer is the necessary number of modules, and the time corresponding to one cycle here is the exposure apparatus CT. Further, the user can select whether or not to perform this restriction in the number of modules used.

Figure 17:
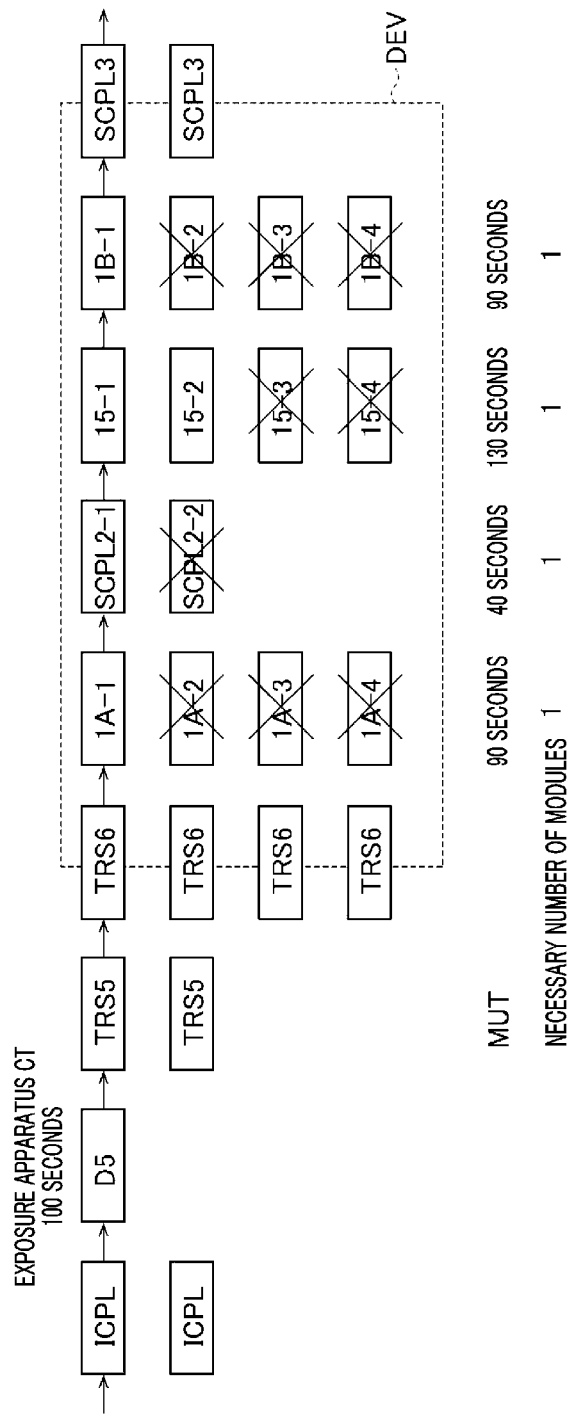
FIG. 17 is an explanatory diagram for describing the third transfer control.

FIG. 17 illustrates an example where the transfer in the DEV layer is performed while restricting the number of modules used, and modules that are not used are assigned X marks. In order to avoid complication of explanation, a calculation method for the necessary number of modules will be first described on the assumption that the DEV layer is not a multi-stack. The MUT of each module divided by the exposure apparatus CT (MUT of each module/exposure apparatus CT) is calculated as the necessary number of modules, and if the result contains a decimal value, the decimal value is discarded to make the result to an integer. For example, it is assumed that the exposure apparatus CT is 100 seconds. For a certain PJ, it is assumed that the MUT of the heating module 1A is calculated as 90 seconds, the MUT of the SCPL2 is calculated as 40 seconds, the MUT of the developing module 15 is calculated as 130 seconds, and the MUT of the heating module 1B is calculated as 90 seconds. In this case, the necessary number of modules for the heating module 1A is calculated as 1 by discarding decimal places of the value of 90 seconds/100 seconds. By the same calculation, the necessary number of modules for the SCPL2, the developing module 15, and the heating module 1B is calculated as 1, 2, and 1, respectively.

As described above, this is a value when the number of stacks used in the DEV layer is set to 1. If the number of stacks in the multi-stack used in the DEV layer is set to three as described so far, the necessary number of modules for each stack may be determined by using the transfer ratio, the same as in Expression 1 for obtaining the MUTCT described above, for example. That is, assuming that wafers W are evenly transferred to the three stacks, the necessary number of modules for the developing module 15 for one stack may be calculated as 1 (130 seconds/the number of multiple stacks (=3)/exposure apparatus CT=1).

As described above, in the multi-module of each stage, which module(s) to be used is determined based on the calculated necessary number of modules. For example, the calculated number of modules may be used in the order of the numbers assigned thereto. Then, the wafers of the PJ, which is the basis of the calculation of this necessary number of modules, are processed by being transferred only to the modules determined to be used as described above. In this way, by limiting the number of modules to be used in the multi-module, the stay time of the wafer W in the modules used in this way becomes the product of the exposure apparatus CT and the necessary number of modules (exposure apparatus CT×necessary number of modules). Thus, as compared to a case where the number of modules is not limited, the wafer W may be promptly transferred to the next stage of module. Therefore, the PPD time may be shortened.

In addition, the calculated necessary number of modules may be different between the preceding PJ and the succeeding PJ. For example, in the heating module 1A, as the processing time is 75 seconds in the preceding PJ and 100 seconds in the succeeding PJ, the MUT and, besides, the necessary number of modules calculated from the MUT may be different between the preceding PJ and the succeeding PJ. When the calculated necessary numbers of modules are different in this way, this case satisfies the above-described condition that the preceding PJ and the succeeding PJ are different flows. Thus, the succeeding PJ is not transferred to the exposure apparatus D5 until the preceding PJ is finished.

As stated above, it can be selected whether or not to limit the number of modules to be used. As an example of this selection, if there is no or small effect on a pattern to be formed on the wafer W even if the PPD time is relatively long, there may be adopted a setting where the number of modules to be used is not restricted, to thereby prevent a decrease in throughput that might occur when the necessary number of modules is changed, causing the wafers W of the succeeding PJ not to be transferred to the exposure apparatus D5. Meanwhile, when the PPD time is relatively long and it has a relatively big influence on the pattern to be formed on the wafer W, there may be adopted a setting where the number of modules to be used is restricted to shorten the PPD time.

[More Details]

As described above, since the first transfer control is performed separately from the second transfer control and the third transfer control, the controller 4 may be configured to perform only the first transfer control or only the second transfer control and the third transfer control among the first to third transfer controls. Further, as for the second transfer control and the third transfer control, only the second transfer control may be performed.

As described above, the exposure apparatus CT is set in performing the third transfer control. Further, in the above description, the output interval of the out-ready signal is regarded as the exposure apparatus CT when performing the first transfer control. However, when the first to third transfer controls are executable, the exposure apparatus CT set to perform the third transfer control may be used in the first transfer control, instead of the output interval of the out-ready signal. Further, although the exposure CT is set as described above in the third transfer control in order to control the PPD time with high accuracy, it is not limited to being set in that way. The same as in the first transfer control, the output interval of the out-ready signal may be regarded as the exposure apparatus CT. Further, in view of the fact that not only the output interval of the out-ready signal but also the output interval of the in-ready signal becomes substantially the same as the exposure apparatus CT when the wafers W are carried into or out from the exposure apparatus D5 at an appropriate interval, the output interval of the in-ready signal acquired at an appropriate timing may be used as the exposure apparatus CT. As described above, the way to acquire the exposure apparatus CT is not particularly limited.

Although the calculation is performed as described above in the first transfer control and the second transfer control to put wafers on standby in the exposure apparatus D5 or the ICPL for the calculated amount of time, an offset time may be set appropriately. Thus, the wafers W may be made to stand by for a time according to the calculated time. Here, the time according to the calculated time includes the calculated time itself.

[Buffer Module]

Figure 18:
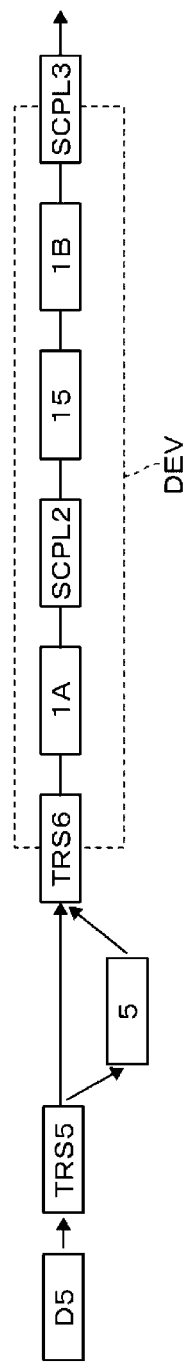
FIG. 18 is a block diagram illustrating a transfer path.

FIG. 18 illustrates an example in which a buffer module 5 configured to temporarily store the wafer W after being subjected to the exposure by the exposure apparatus D5 and before being transferred to the DEV layer is provided in the interface block D4, and a transfer is performed by using this buffer module 5. Here, the transfer is performed in the state that the third transfer control of allowing the above-described PPD time to be equal has been performed. To outline this transfer, the wafer W is carried out from the exposure apparatus D5 and transferred to the TRS5. Then, depending on conditions, the wafer W of the TRS5 is transferred directly to the TRS6, which is the entrance of the DEV layer, or transferred to the TRS6 after being once stored in the buffer module 5, which is a storage module. Further, after being sent to the TRS6, the wafer W is transferred to the individual modules in the DEV layer sequentially as described above.

The buffer module 5 is equipped with a housing to/from which wafers W can be carried from the side, and is capable of storing the wafers W in the housing while arranging the wafers W in a vertical direction. A supply port for supplying a $N_2$ gas is opened in this housing, and the inside of the housing is set to be in a $N_2$ gas atmosphere. Therefore, the atmosphere of the region in which the wafer W is stored in the housing is different from the atmospheric atmosphere outside the housing. It has been described above that the CD of the resist pattern fluctuates due to the fluctuation of the PED time. This is because of the action of components in the air in a clean room where the coating and developing apparatus 1 is provided. As will be described later, in performing the third transfer control, the PED time may become inconsistent between the wafers W of the same PJ due to a variation of the exposure apparatus CT. By storing the wafer W in the buffer module 5 when necessary, the wafer W can be suppressed from being exposed to the atmosphere, and, accordingly, non-uniformity of the CD due to the discrepancy of the PED time can be suppressed.

Figure 19:
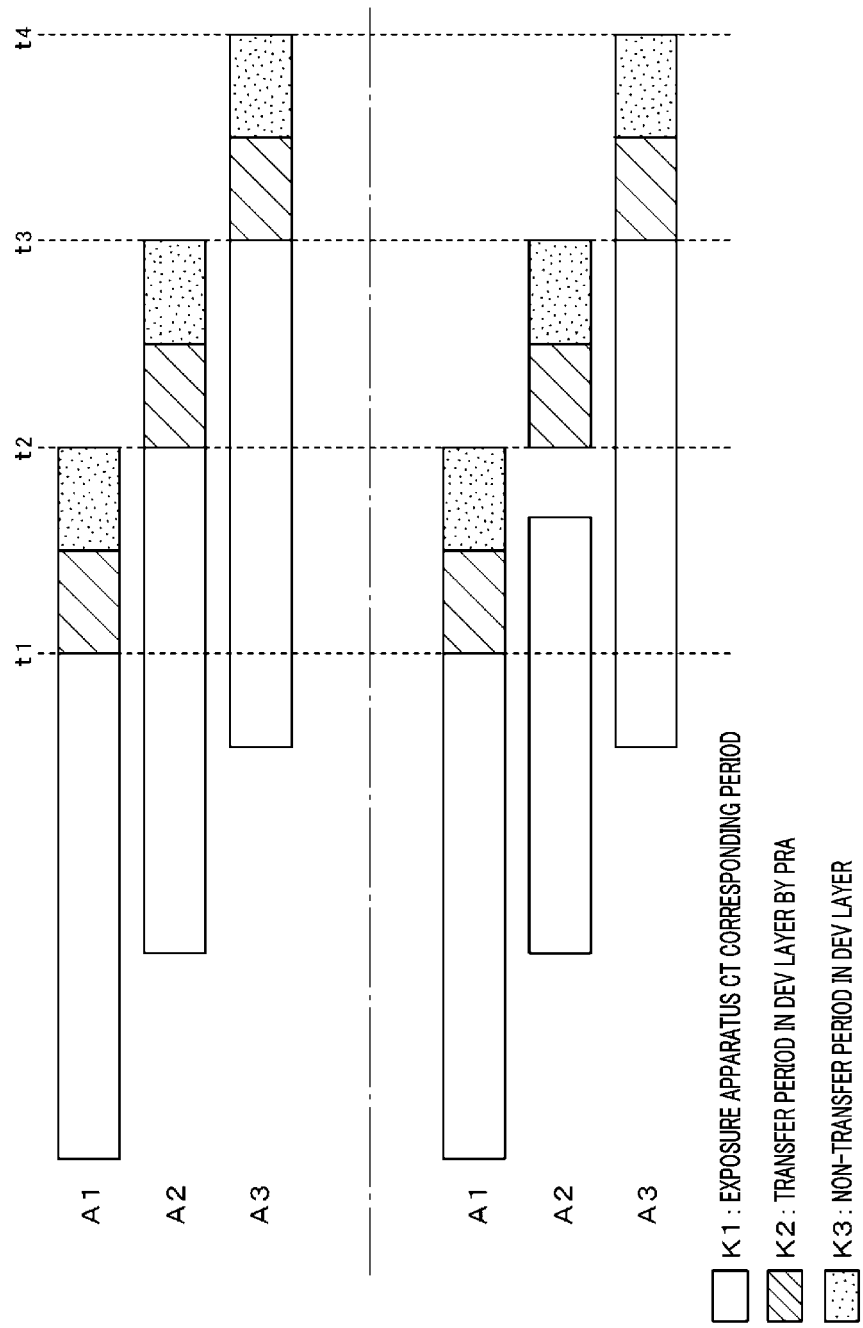
FIG. 19 is an explanatory diagram for describing a role of a buffer module.
Figure 20:
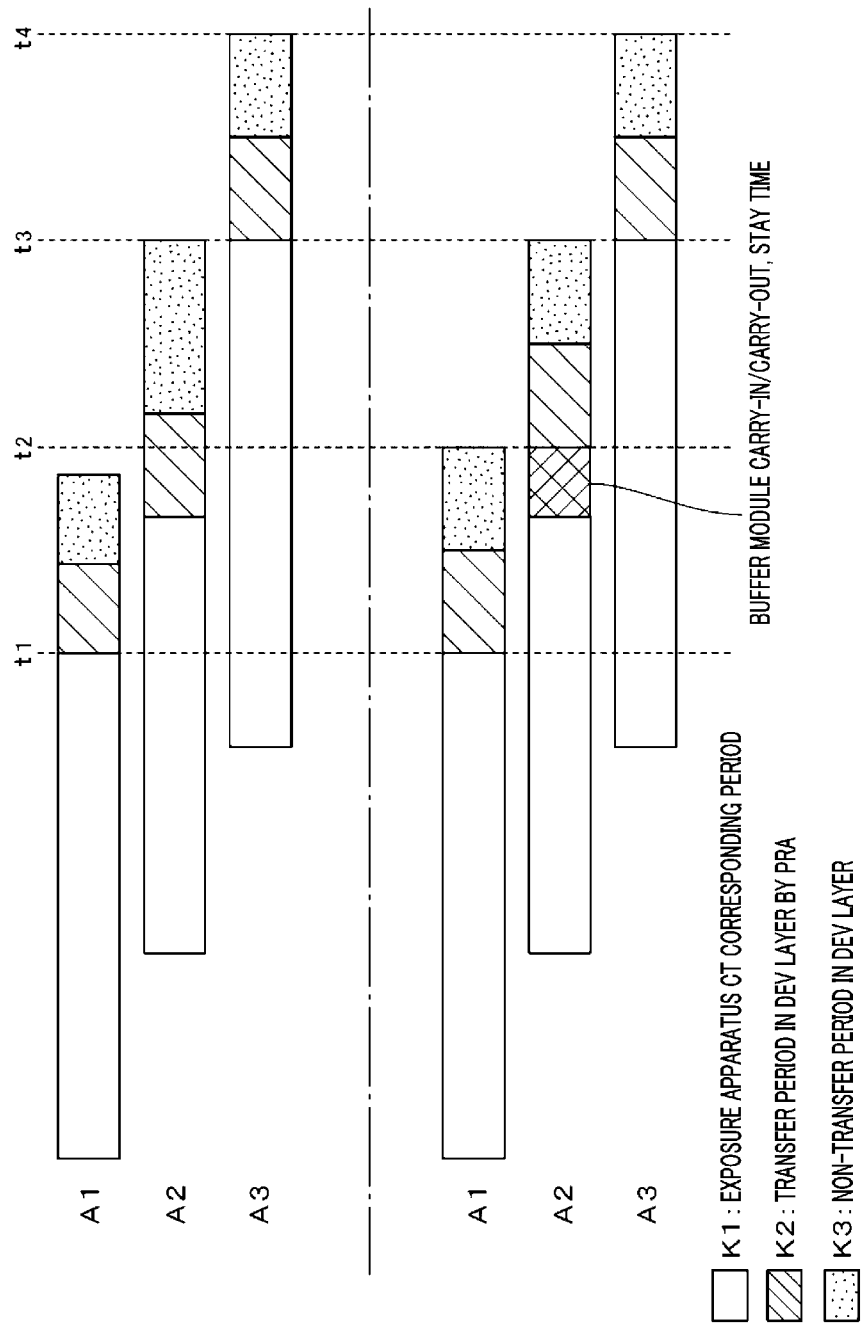
FIG. 20 is an explanatory diagram for describing the role of the buffer module.

The role of the buffer module 5 will be explained in more detail by using timing charts of FIG. 19 and FIG. 20. Here, for convenience of explanation, the number of stacks of the DEV layer is assumed to be one. However, the transfer can be carried out in the same way even when there are a plurality of stacks. The charts of FIG. 19 and FIG. 20 show transfer examples of the wafers A1 to A3 of the PJ-A. In FIG. 19 and FIG. 20, different transfer examples are shown, and, also, even in the same drawing, different transfer examples are respectively shown at the upper and lower parts.

In the charts, K1 denotes a period equivalent to a sum of a time period from when the wafer W is carried into the exposure apparatus D5 until the out-ready signal is outputted and a time period during which the wafer W is transferred in the interface block D4 (the IFB layer, the IFBS layer). Therefore, this period K1 is a period whose length varies according to the exposure apparatus CT, and is referred to as an exposure apparatus CT corresponding period. In the drawing, K2 denotes a period during which the wafer W is transferred in the DEV layer by the PRA36, and is referred to as a DEV layer transfer period. In the drawing, K3 denotes a sum of a time period in which the wafer W is processed in the module in the DEV layer and a time period in which the wafer W stands by before being received by the PRA36. Therefore, this period K3 is a period whose length varies according to the lap time of the PRA36, and is referred to as a non-transfer period.

A period equivalent to the sum of the DEV layer transfer period K2 and the non-transfer period K3 is a period during which the wafer W stays in the DEV layer. In practice, for each of the wafers A1 to A3, the periods K2 and K3 alternately and repeatedly appear over time. In the charts, to avoid complication, the periods K2 are combined into one, and the periods K3 are combined into one. The timing of the start of the DEV layer transfer period K2 combined into one in this way indicates the timing at which the PRA36 receives the wafer W at the entrance of the DEV layer. Also, in the charts, time t1 to t4 are shown at a regular interval.

The transfer example in the upper part of FIG. 19 shows a state in which the exposure apparatus CT is constant when the third transfer control is performed, and the wafers A1, A2, and A3 are received by the PRA36 of the DEV layer at times t1, t2, and t3, respectively. Then, the PRA36 moves around with the lap time equal to the exposure apparatus CT, and the wafers A1 to A3 are transferred and processed in the DEV layer. Then, the wafers A1, A2, and A3 are carried out from the DEV layer at the times t2, t3, and t4, respectively. By carrying out the transfer in this way, the PED time and the PPD time become consistent between the wafers A1 to A3.

The transfer examples in the lower part of FIG. 19 and the upper and lower parts of FIG. 20 show a state in which there is a change in the exposure apparatus CT. To be specific, they illustrate transfer examples in which the out-ready signal for the wafer A1 is outputted earlier than a scheduled timing. In the transfer example of the lower part of FIG. 19, the transfer control is performed such that the wafer A2 is received by the PRA36 at the time t2, the same as in the example of the upper part of FIG. 19. Accordingly, this wafer A2 stands by in the exposure apparatus D5 longer than the example of the upper part of FIG. 19, and, therefore, the PED time of the wafer A2 is different from the PED time of the wafers A1 and A3. In addition, since the PRA36 transfers the wafers A1 to A3 with the constant lap time, the PPD time is consistent between the wafers A1 to A3.

The upper part of FIG. 20 shows an example where the transfer control is performed such that the PED time is consistent between the wafers A1 to A3. For the wafer A1, the standby time in the module is shortened. That is, the period K3 of the wafer A1 is shortened. Accordingly, the PRA36 receives the wafer A2 at the entrance TRS6 of the DEV layer at a time earlier than the time t2. Then, the period K3 of the wafer A2 is extended, and the wafer A3 is received by the PRA36 at the entrance of the DEV layer at the time t3, the same as shown in the upper part of FIG. 19. However, since changing the period K3 between the wafers A1 to A3 in this way causes fluctuation of the lap time of the PRA36, the PPD time becomes non-uniform between the wafers A1 to A3.

Therefore, instead of changing the period K3 of the wafers A1 and A2, the wafer A2 is temporarily stored in the buffer module 5 before it is transferred to the entrance of the DEV layer. Then, the wafer A2 is transferred to the entrance of the DEV layer, and the PRA36 receives the wafer W2 at the time t2, the same as in the case where the exposure apparatus CT is constant. Further, the wafers A1 and A3 are transferred in the same manner as in the example shown in the upper part of FIG. 19, and are respectively received by the PRA36 at the times t1 and t3. By carrying out the transfer control in this way, influence of the change in the PED time between the wafers A1 to A3 described in the lower part of FIG. 19 is suppressed in the transfer example shown in the lower part of FIG. 20. Furthermore, since the PRA36 transfers the wafers A1 to A3 with the constant lap time in the transfer example of the lower part of FIG. 20, the same as in the transfer example of the lower part of FIG. 19, the PPD time is rendered consistent between the wafers A1 to A3. Therefore, in the transfer example shown in the lower part of FIG. 20, the deterioration of the uniformity of the CD of the resist pattern between the wafers A1 to A3 is suppressed.

The transfer example in the lower part of FIG. 20 corresponds to the transfer example shown in FIG. 18. In explaining this transfer example in more detail, the controller 4 makes a determination upon whether or not an actual output timing of the out-ready signal of the exposure apparatus D5 (actual carry-out allowing timing) is earlier than a planned output timing (planned carry-out allowing timing) based on the exposure apparatus CT. Then, the wafers A1 and A3 for which it is determined that the actual output timing is not earlier than the planned output timing are transferred to the entrance TRS6 of the DEV layer without passing through the buffer module 5. Meanwhile, the wafer A2 for which it is determined that the actual output timing is earlier than the planned output timing is transferred to the entrance of the DEV layer via the buffer module 5 as described above. In this way, according to the deviation in the output timing of the out-ready signal, a decision is made as to whether or not to transfer the wafers to the buffer module 5, and the transfer control is performed based on the determination result so that the transfer path of the wafers A1 and A3 and the transfer path of the wafer A2 may be different.

In order for the PRA36 to be able to receive the wafer A2 at the time t2, the wafer A2 stands by in the buffer module 5 for an amount of time corresponding to the deviation amount between the planned output timing and the actual output timing for the out-ready signal. As a specific example, the wafer A2 is put on standby for a time calculated by subtracting, from the time equivalent to the deviation amount, a time required for the transfer from the TRS5 to the buffer module 5 and a time required for the transfer from the buffer module 5 to the TRS6 at the entrance of the DEV layer.

Figure 21:
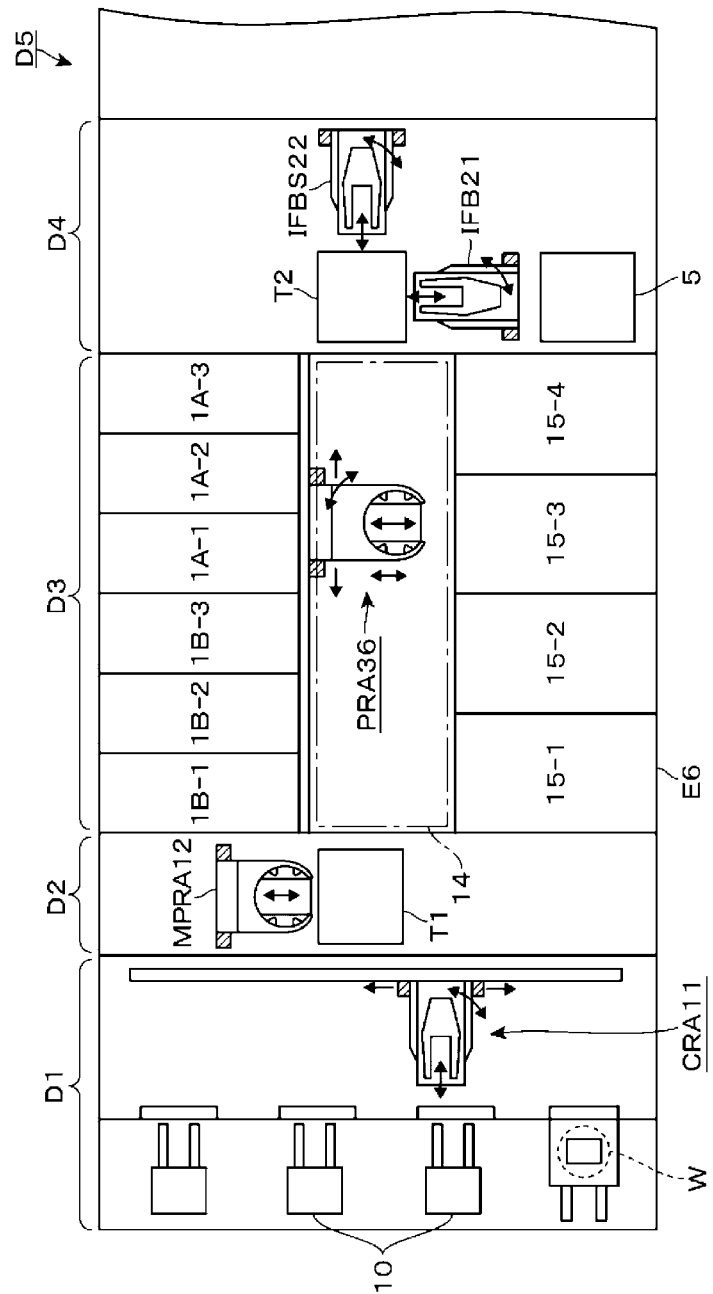
FIG. 21 is a plan view showing another example of the coating and developing apparatus.

FIG. 21 shows a configuration example of the interface block D4 equipped with the buffer module 5. Unlike the example shown in FIG. 1, the IFBS22 is disposed on the right side of the tower T2, the IFB21 is disposed on the front side of the tower T2, and the buffer module 5 is disposed on the front side of the IFB21. Moreover, the exemplary embodiment is not limited to setting up such a layout, and the buffer module 5 may be provided as a module that constitutes the tower T2, for example. The arrangement of the IFB21 and the IFBS22 can also modified appropriately as long as the transfer of the wafer W to/from the above-described modules and the exposure apparatus D5 can be carried out. The number of the transfer mechanisms in the interface block D4 is not limited to the two (IFB21 and IFBS22), and an appropriate number of transfer mechanisms may be provided according to the number and the layout of the modules to be installed.

In addition, the variation of the CD of the resist pattern due to the PED time is caused by the components in the air as mentioned above, and it is assumed that the effect of moisture among these components is big. For this reason, as a gas supplied into the housing of the buffer module 5, a gas that makes the atmosphere inside the housing and the atmosphere outside the housing different from each other, and, more specifically, a gas that lowers the relative humidity within the housing as compared to that at the outside of the housing is desirably used. Therefore, the gas supplied into the housing is not limited to the $N_2$ gas, and may be an inert gas, such as an argon gas, other than the $N_2$ gas, or a gas such as dry air having a water content lower than that of the atmosphere around the housing. Furthermore, the buffer module 5 has been described to be capable of storing the plurality of wafers W therein. However, when the transfer to the buffer module 5 is performed sporadically, there may be adopted a configuration in which the buffer module 5 stores only one sheet of wafer W therein by using the exposure apparatus D5 having a relatively stable exposure apparatus cycle time.

As explained in the above description, the cycle of the DEV layer is constant for the wafers W of the same PJ, and by keeping the wafer W on standby in the $N_2$ gas atmosphere until the PRA of the DEV layer receives the wafer W, influence of the non-uniformity of the PED time can be suppressed, so that the CD of the pattern can be uniformed between the wafers W. For this reason, the entrance of the DEV layer, that is, the TRS6 may be configured by the buffer module 5. That is, the buffer module 5 only needs to be provided on the transfer path ranging from the exposure apparatus D5 to the entrance of the DEV layer. In this case, "ranging to the entrance" includes the entrance itself.

In addition, the substrate processing apparatus is not limited to the coating and developing apparatus. By way of example, an apparatus configured to perform only a processing after the exposure and the development without performing the resist coating may be used. Further, the substrate is not limited to the wafer W, and may be a flat panel display (FPD) substrate. The exemplary embodiments disclosed herein are illustrative in all aspects and do not limit the present disclosure. The above-described exemplary embodiments may be omitted, replaced, modified, and combined in various ways without departing from the scope and the spirit of the appended claims.

According to the present disclosure, it is possible to suppress the non-uniformity in the transfer states of the substrates after being subjected to the exposure in the exposure apparatus, thus capable of suppressing the non-uniformity in patterns formed on the substrates by the development.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate transfer method performed in a substrate processing apparatus including a transfer mechanism group configured to transfer a substrate taken out from a carrier back into the carrier via a module group and an exposure apparatus,
   wherein the module group comprises a pre-stage module configured to place the substrate therein in an upstream of the exposure apparatus, a first and a second post-stage modules each configured to place the substrate therein in a downstream of the exposure apparatus, a heating module, and a developing module,
   the transfer mechanism group comprises a first transfer mechanism configured to transfer the substrate in an order of the pre-stage module, the exposure apparatus, and the first post-stage module, and a second transfer mechanism configured to transfer the substrate in an order of the first post-stage module, the heating module, the developing module, and the second post-stage module, and one or more post-stage transfer mechanisms each configured to transfer the substrate from the second post-stage module toward the carrier, and
   wherein the substrate transfer method comprises:
   acquiring an exposure apparatus cycle time, which is an interval between a time point when the substrate is carried into the exposure apparatus and a time point when the substrate is allowed to be carried out of the exposure apparatus,
   acquiring a section transfer time, which is acquired for the substrate scheduled to be transferred to the exposure apparatus, required to transfer the substrate from a transfer section by the second transfer mechanism to a transfer section by the post-stage transfer mechanism;
   comparing the exposure apparatus cycle time with the section transfer time; and
   setting the section transfer time based on a result of the comparing of the exposure apparatus cycle time with the section transfer time.

2. The substrate transfer method of claim 1,
   wherein in the setting of the section transfer time, the section transfer time is set to be equal to the exposure apparatus cycle time when the exposure apparatus cycle time is found to be longer than the section transfer time in the comparing of the exposure apparatus cycle time with the section transfer time.

3. The substrate transfer method of claim 2, further comprising:
   storing the substrate, which is transferred to a storage module after being carried out from the exposure apparatus and before being transferred to the first post-stage module, in a region in which an atmosphere different from that of a vicinity thereof is formed.

4. The substrate transfer method of claim 3,
   wherein whether or not to perform the storing of the substrate is determined according to a deviation between a planned carry-out allowing timing of the substrate from the exposure apparatus based on the exposure apparatus cycle time and an actual carry-out allowing timing.

5. The substrate transfer method of claim 4, wherein the storing of the substrate comprises allowing the substrate to stay in the storage module for a time period corresponding to an amount of the deviation.

6. The substrate transfer method of claim 2, wherein when modules configured to perform a same kind of processing on the substrate are set as a multi-module, the substrate transfer method further comprises:
determining, for the multi-module in the transfer section of the second transfer mechanism, a number of modules to be used based on stay time of the substrate in the module and the exposure apparatus cycle time; and
transferring the substrate to the determined number of modules in a state that the setting of the section transfer time is performed.

7. The substrate transfer method of claim 3, wherein the setting of the section transfer time is not performed when the exposure apparatus cycle time is found to be equal to or less than the section transfer time in the comparing of the exposure apparatus cycle time with the section transfer time.

8. The substrate transfer method of claim 7, wherein in transferring a lot including a plurality of the substrates, the section transfer time is not changed until a last substrate of the lot is transferred to the second post-stage module by the second transfer mechanism after a first substrate of the lot is transferred by the second transfer mechanism.

9. The substrate transfer method of claim 8, further comprising:
acquiring, for each of transfer sections corresponding to the respective transfer mechanisms each configured to transfer the substrate in a transfer path in the downstream of the exposure apparatus, a section transfer time required to transfer the substrate to a next transfer section; and
carrying the substrate into the exposure apparatus by the first transfer mechanism based on a maximum section transfer time, which is the longest among the acquired section transfer times,
wherein the carrying of the substrate comprises:
comparing the maximum section transfer time with a total time of a time required to transfer the substrate from the pre-stage module to the exposure apparatus and an elapsed time after the transfer of the substrate to the exposure apparatus immediately before; and
transferring, when the maximum section transfer time is found to be longer than the total time as a result of the comparing of the maximum section transfer time with the total time, a substrate, which is scheduled to be transferred to the exposure apparatus next, to the exposure apparatus after allowing the substrate to stand by in the pre-stage module for a time corresponding to a difference between the total time and the maximum section transfer time.

10. The substrate transfer method of claim 9, wherein the acquiring of the section transfer time comprises:
acquiring a first candidate of the section transfer time according to a stay time of the substrate, which is located in the transfer section, in each module and a number of modules to be used in a multi-module; and
acquiring a second candidate of the section transfer time, corresponding to a number of transfer processes of the transfer mechanism in the transfer section, and
wherein a longest one of the first candidate and the second candidate acquired from the respective transfer sections is the maximum section transfer time.

11. The substrate transfer method of claim 10, further comprising:
re-acquiring the maximum section transfer time when there is a change in the number of modules to be used in the multi-module.

12. The substrate transfer method of claim 1, wherein, for a first lot of the substrate to be first transferred to the downstream of the exposure apparatus and a second lot of the substrate to be transferred next,
when the section transfer time of the second transfer mechanism while transferring the first lot and the section transfer time of the second transfer mechanism while transferring the second lot are different, or when a transfer path at the downstream of the exposure apparatus is different between the first lot and the second lot,
a transfer of the second lot to the exposure apparatus is stopped until a last substrate of the first lot is transferred to the carrier.

13. A substrate processing apparatus comprising:
a transfer mechanism group configured to transfer a substrate taken out from a carrier back into the carrier via a module group and an exposure apparatus, the module group including a pre-stage module configured to place the substrate therein in an upstream of the exposure apparatus, a first to a second post-stage module each configured to place the substrate therein in a downstream of the exposure apparatus, a heating module, and a developing module, the transfer mechanism group including a first transfer mechanism configured to transfer the substrate in an order of the pre-stage module, the exposure apparatus, and the first post-stage module, and a second transfer mechanism configured to transfer the substrate in an order of the first post-stage module, the heating module, the developing module, and the second post-stage module, and one or more post-stage transfer mechanisms each configured to transfer the substrate from the second post-stage module toward the carrier; and
a controller configured to output control signals to perform:
acquiring an exposure apparatus cycle time, which is an interval between a time point when the substrate is carried into the exposure apparatus and a time point when the substrate is allowed to be carried out of the exposure apparatus
acquiring a section transfer time, which is acquired for the substrate scheduled to be transferred to the exposure apparatus, required to transfer the substrate from a transfer section by the second transfer mechanism to a transfer section by the post-stage transfer mechanism;
comparing the exposure apparatus cycle time with the section transfer time; and
setting the section transfer time based on a result of the comparing of the exposure apparatus cycle time with the section transfer time.

14. The substrate processing apparatus of claim 13, wherein in the setting of the section transfer time, when the exposure apparatus cycle time is found to be longer than the section transfer time in the comparing of the exposure apparatus cycle time with the section transfer time, the section transfer time is changed to the exposure apparatus cycle time.

15. The substrate processing apparatus of claim 14, further comprising:
a storage module configured to store therein the substrate after being carried out from the exposure apparatus and before being carried into the first post-stage module,
wherein the storage module stores the substrate in a region in which an atmosphere different from that of a vicinity thereof is formed.

16. A computer-readable recording medium having stored thereon computer-executable programs that, in response to execution on a computer, cause a substrate transfer method as claimed in claim 1 to be performed.

* * * * *